US012776377B2

(12) United States Patent
Tian et al.

(10) Patent No.: US 12,776,377 B2
(45) Date of Patent: Oct. 27, 2026

(54) ENHANCED INDEPENDENT BIT SCAN MODE FOR NEIGHBOR PLANE DISTURB DETECTION FOR MEMORY DEVICES

(71) Applicant: Sandisk Technologies Inc., Milpitas, CA (US)

(72) Inventors: Xuan Tian, Shanghai (CN); Liang Li, Shanghai (CN); Vincent Yin, Shanghai (CN)

(73) Assignee: Sandisk Technologies, Inc., Milpitas, CA (US)

( * ) Notice: Subject to any disclaimer, the term of this patent is extended or adjusted under 35 U.S.C. 154(b) by 199 days.

(21) Appl. No.: 18/643,114

(22) Filed: Apr. 23, 2024

(65) Prior Publication Data

US 2025/0329396 A1 Oct. 23, 2025

(51) Int. Cl.

| | |
|---|---|
| ***G11C 16/34*** | (2006.01) |
| ***G11C 16/10*** | (2006.01) |
| *G11C 11/56* | (2006.01) |
| *G11C 16/04* | (2006.01) |

(52) U.S. Cl.

CPC .......... *G11C 16/3427* (2013.01); *G11C 16/10* (2013.01); *G11C 16/3459* (2013.01)

(58) Field of Classification Search

CPC . G11C 16/3427; G11C 16/10; G11C 16/3459; G11C 11/5628; G11C 16/0483

See application file for complete search history.

(56) References Cited

U.S. PATENT DOCUMENTS

| | | | |
|---|---|---|---|
| 9,570,160 B1 | 2/2017 | Shah et al. | |
| 10,134,474 B1 | 11/2018 | Chen | |
| 10,529,435 B2 | 1/2020 | Puthenthermadam et al. | |
| 11,605,436 B2 | 3/2023 | Chin et al. | |
| 11,657,883 B2 | 5/2023 | Zhang et al. | |
| 2010/0172185 A1* | 7/2010 | Kim .................. | G11C 16/3454 365/185.19 |
| 2019/0214100 A1* | 7/2019 | Puthenthermadam ....................... | G11C 16/3427 |

(Continued)

FOREIGN PATENT DOCUMENTS

CN 120612990 A * 9/2025 ......... G11C 16/3436

OTHER PUBLICATIONS

Translation of CN120612990A (Year: 2025).*

*Primary Examiner* — Sultana Begum

*Assistant Examiner* — Elizabeth Rose Agger

(74) *Attorney, Agent, or Firm* — Dickinson Wright PLLC

(57) ABSTRACT

A memory device includes a plurality of memory cells arranged in a plurality of planes and control circuitry configured to perform a multi-plane programming operation in which memory cells in each of the plurality of planes are programmed in a single programming operation. To perform the multi-plane programming operation, the control circuitry is configured to detect a neighbor plane disturb (NPD) defect during the multi-plane programming operation by performing a bit scan operation to identify, based on a first program verify threshold, a fast plane and a slow plane from among the plurality of planes, determining whether the fast plane passes a second program verify threshold greater than the first program verify threshold, identifying one of the fast plane and the slow plane as a failed plane based on the determination of whether the fast plane passes the second program verify threshold, and terminating programming of the identified failed plane.

14 Claims, 16 Drawing Sheets

(56) References Cited

U.S. PATENT DOCUMENTS

| | | | | |
|---|---|---|---|---|
| 2022/0399061 | A1* | 12/2022 | Chin | G11C 16/349 |
| 2022/0415421 | A1* | 12/2022 | Tian | G11C 16/3459 |
| 2023/0148416 | A1* | 5/2023 | Guo | G11C 8/12<br>365/189.011 |
| 2023/0268013 | A1 | 8/2023 | Murai et al. | |
| 2025/0226044 | A1* | 7/2025 | Tian | G11C 16/0483 |
| 2025/0372185 | A1* | 12/2025 | Zainuddin | G11C 16/3459 |

* cited by examiner

FAKE FAST PLANE CASE

NORMAL FAST PLANE CASE

ENHANCED INDEPENDENT BIT SCAN MODE FOR NEIGHBOR PLANE DISTURB DETECTION FOR MEMORY DEVICES

BACKGROUND

1. Field

The present disclosure is related generally to techniques for detecting neighbor plane disturb (NPD) in memory devices.

2. Related Art

Semiconductor memory is widely used in various electronic devices, such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power, e.g., a battery. As one example, a NAND memory device includes a chip with a plurality of memory blocks, each of which includes an array of memory cells arranged in a plurality of word lines.

Memory systems can be used to store data provided by a host device (or other client). However, various challenges are presented in operating such memory systems. In particular, memory cells of the memory system may be arranged in multiple planes connected to the same word lines and programmed concurrently. However, certain word line defects on one plane may disturb programming of memory cells on the concurrently programmed planes and may lead to overprogramming. Thus, there is a need for improved memory apparatuses and methods of operation that overcome such challenges.

SUMMARY

This section provides a general summary of the present disclosure and is not a comprehensive disclosure of its full scope or all of its features and advantages.

A memory device includes a plurality of memory cells arranged in a plurality of planes and control circuitry configured to perform a multi-plane programming operation in which memory cells in each of the plurality of planes are programmed in a single programming operation. To perform the multi-plane programming operation, the control circuitry is configured to detect a neighbor plane disturb (NPD) defect during the multi-plane programming operation by performing a bit scan operation to identify, based on a first program verify threshold, a fast plane and a slow plane from among the plurality of planes, determining whether the fast plane passes a second program verify threshold greater than the first program verify threshold, identifying one of the fast plane and the slow plane as a failed plane based on the determination of whether the fast plane passes the second program verify threshold, and terminating programming of the identified failed plane.

In other features, the control circuitry is configured to identify the fast plane as the failed plane in response to a determination that the fast plane passes the second program verify threshold and identify the slow plane as the failed plane in response to a determination that the fast plane does not pass the second program verify threshold. Identifying the fast plane includes determining, based on the first program verify threshold, whether the fast plane has reached a judgment memory state. The second program verify threshold corresponds to a memory state higher than the judgment memory state. To perform the bit scan operation, the control circuitry is configured to determine respective portions of voltage distributions of the memory cells of each of the plurality of planes that are greater than the first program verify threshold. To determine whether the fast plane passes the second program verify threshold, the control circuitry is configured to determine a portion of a voltage distribution of the memory cells of the fast plane that is greater than the second program verify threshold. The second program verify threshold is offset from the first program verify voltage by approximately 1 V.

A method for operating a memory device including a plurality of memory cells arranged in a plurality of planes includes performing a multi-plane programming operation in which memory cells in each of the plurality of planes are programmed in a single programming operation. To perform the multi-plane programming operation, a neighbor plane disturb (NPD) defect is detected during the multi-plane programming operation by performing a bit scan operation to identify, based on a first program verify threshold, a fast plane and a slow plane from among the plurality of planes, determining whether the fast plane passes a second program verify threshold greater than the first program verify threshold, identifying one of the fast plane and the slow plane as a failed plane based on the determination of whether the fast plane passes the second program verify threshold, and terminating programming of the identified failed plane.

In other features, the method includes identifying the fast plane as the failed plane in response to a determination that the fast plane passes the second program verify threshold and identifying the slow plane as the failed plane in response to a determination that the fast plane does not pass the second program verify threshold. Identifying the fast plane includes determining, based on the first program verify threshold, whether the fast plane has reached a judgment memory state. The second program verify threshold corresponds to a memory state higher than the judgment memory state. The method further includes, to perform the bit scan operation, determining respective portions of voltage distributions of the memory cells of each of the plurality of planes that are greater than the first program verify threshold. Determining whether the fast plane passes the second program verify threshold includes determining a portion of a voltage distribution of the memory cells of the fast plane that is greater than the second program verify threshold. The second program verify threshold is offset from the first program verify voltage by approximately 1 V.

A memory device includes a plurality of memory cells arranged in a plurality of planes and control means for performing a multi-plane programming operation in which memory cells in each of the plurality of planes are programmed in a single programming operation. To perform the multi-plane programming operation, the control means detects a neighbor plane disturb (NPD) defect during the multi-plane programming operation by performing a bit scan operation to identify, based on a first program verify threshold, a fast plane and a slow plane from among the plurality of planes, determining whether the fast plane passes a second program verify threshold greater than the first program verify threshold, identifying one of the fast plane and the slow plane as a failed plane based on the determination of whether the fast plane passes the second program verify threshold, and terminating programming of the identified failed plane.

In other features, the control means identifies the fast plane as the failed plane in response to a determination that the fast plane passes the second program verify threshold and identifies the slow plane as the failed plane in response to a determination that the fast plane does not pass the second program verify threshold. Identifying the fast plane includes determining, based on the first program verify threshold, whether the fast plane has reached a judgment memory state. The second program verify threshold corresponds to a memory state higher than the judgment memory state. To perform the bit scan operation, the control means determines respective portions of voltage distributions of the memory cells of each of the plurality of planes that are greater than the first program verify threshold. To determine whether the fast plane passes the second program verify threshold, the control means determines a portion of a voltage distribution of the memory cells of the fast plane that is greater than the second program verify threshold.

Further areas of applicability will become apparent from the description provided herein. The description and specific examples in this summary are intended for purposes of illustration only and are not intended to limit the scope of the present disclosure.

BRIEF DESCRIPTION OF THE DRAWINGS

These and other features and advantages of the present disclosure will become more readily appreciated when considered in connection with the following description of the presently preferred embodiments, appended claims and accompanying drawings, in which:

DESCRIPTION OF THE ENABLING EMBODIMENT

Figure 1:
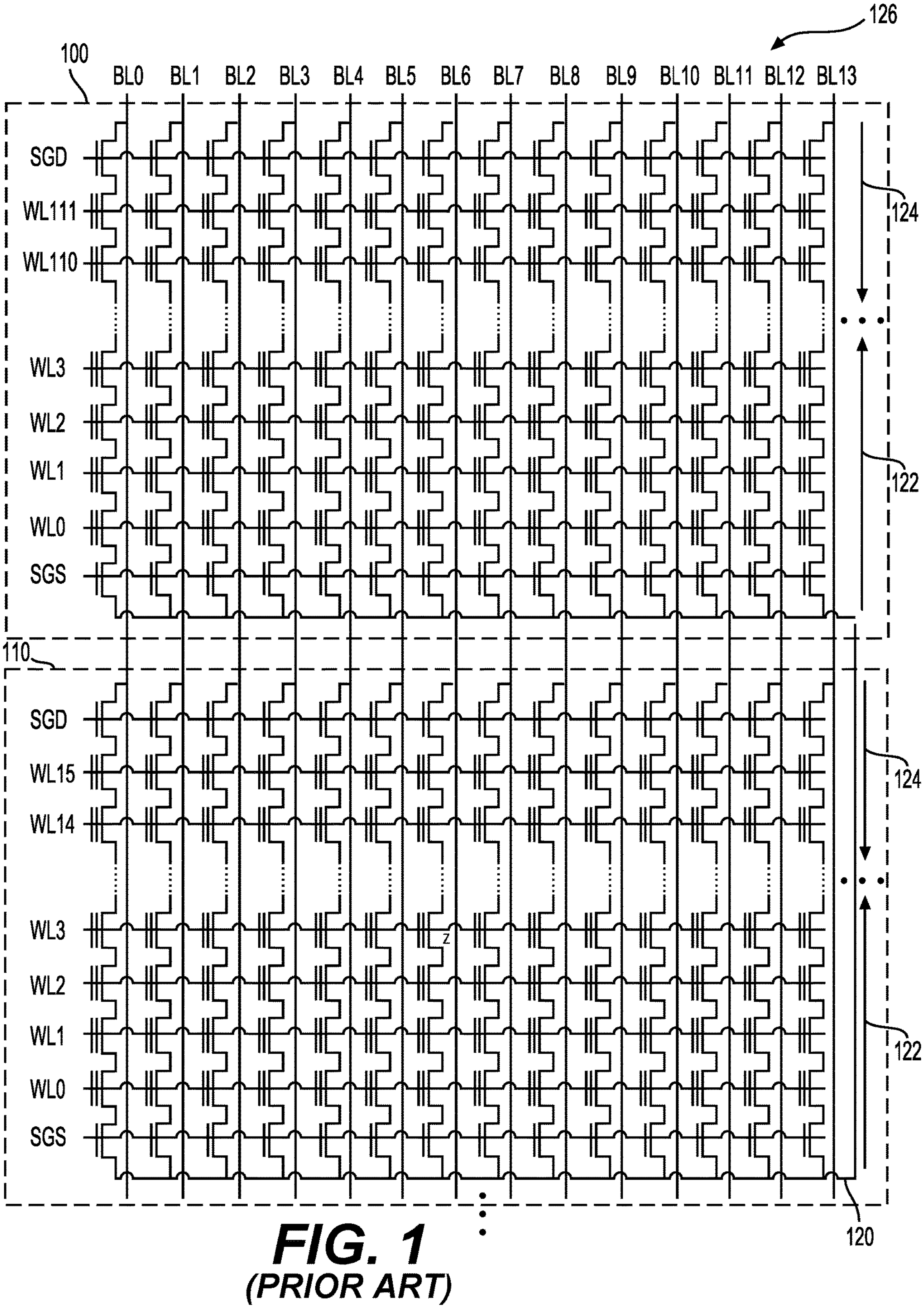
FIG. 1 (PRIOR ART)
FIG. 1 depicts blocks of memory cells in an example two-dimensional configuration of a memory array.

In the following description, details are set forth to provide an understanding of the present disclosure. In some instances, certain circuits, structures and techniques have not been described or shown in detail in order not to obscure the disclosure.

In general, the present disclosure relates to non-volatile memory apparatuses of the type well-suited for use in many applications. The non-volatile memory apparatus and associated methods of operation of this disclosure will be described in conjunction with one or more example embodiments. However, the specific example embodiments disclosed are merely provided to describe the inventive concepts, features, advantages and objectives with sufficient clarity to permit those skilled in this art to understand and practice the disclosure. Specifically, the example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

Some non-volatile memory devices are used to store two ranges of charges and, therefore, the memory cells can be programmed/erased between two data states: an erased state and a programmed state (corresponding to data "1" and data "0"). Such a device is referred to as a binary device or a single-level cell (SLC) and the data are binary data.

In contrast, a multi-state flash memory cell (storing multi-state data) is implemented by identifying multiple, distinct allowed threshold voltage ranges. Each distinct threshold voltage range corresponds to a predetermined value for the set of data bits. For example, some memory cells can store two or more bits. The specific relationship between the data programmed into the memory cell and the threshold voltage ranges of the memory cell depends upon the data encoding scheme adopted for the memory cells.

In addition to the gains in capacity resulting from multi-state memory architectures, significant advantages in memory technology have resulted from steadily scaling down the physical dimensions of memory cells. Smaller memory cells can be packed more densely on a given die area, allowing higher memory capacity for the same price as an older memory technology. However, scaling the sizes of memory cells entails certain risks.

For example, densely packing such smaller memory cells may result in increased manufacturing defects, such as shorting between adjacent word lines, shorting between word lines and interconnects, shorting between word lines and the substrate, and broken word lines. Such manufacturing defects often result in corruption of data stored on the word lines being programmed and nearby word lines.

In some cases, these manufacturing defects are not realized during tests conducted during manufacturing and prior to packaging and shipping the memory devices. Instead, such latent manufacturing defects may only begin to corrupt data after an end user begins programing and erasing the memory cells in such memory devices.

Some memory technologies seek to combat latent manufacturing defects by reading programmed data after programming or evaluating performance after completing programming. However, by the time programming has completed, the programming process may have already damaged data stored in other nearby memory cells.

In addition, some non-volatile memory devices include a multi-plane memory structure organization, and memory cells in the multiple planes connected to the same word lines (e.g., blocks in different planes connected to same word lines) may be programmed concurrently. Although multi-plane programming may increase programming speed, any defects such as the word line defects described above on one plane may disturb programming of memory cells on the concurrently programmed planes. One type of defect may be referred to as "neighbor plane disturb" (NPD), which occurs when programming memory cells of one plane causes a small amount of charge to leak to memory cells of neighboring planes, which may unintentionally change states of the memory cells in the neighboring planes.

Systems and methods according to the present disclosure are configured to detect NPD defects or failures during multi-plane programming operations.

A pair of example memory blocks 100, 110 are illustrated in a FIG. 1. The memory blocks 100, 110 may be implemented in a system comprising a controller or control circuitry configured to implement NPD detection techniques according to the present disclosure. In this example, the memory blocks 100, 110 have a two-dimensional configuration. A memory array in the chip can include many such blocks 100, 110. Each example block 100, 110 includes a number of NAND strings and respective bit lines, e.g., BL0, BL1, . . . which are shared among the blocks. Each NAND string is connected at one end to a drain-side select gate (SGD), and the control gates of the drain select gates are connected, in some examples, via a common SGD line. The NAND strings are connected at their other end to a source-side select gate (SGS) which, in turn, is connected to a common source line 120. One hundred and twelve word lines (WL0-WL111), for example, extend between the SGSs and the SGDs. In some embodiments, the memory block may include more or fewer than one hundred and twelve word lines. For example, in some embodiments, a memory block includes one hundred and sixty-four word lines. In some cases, dummy word lines, which contain no user data, can also be used in the memory array adjacent to the select gate transistors. Such dummy word lines can shield the edge data word line from certain edge effects.

Figure 2A:
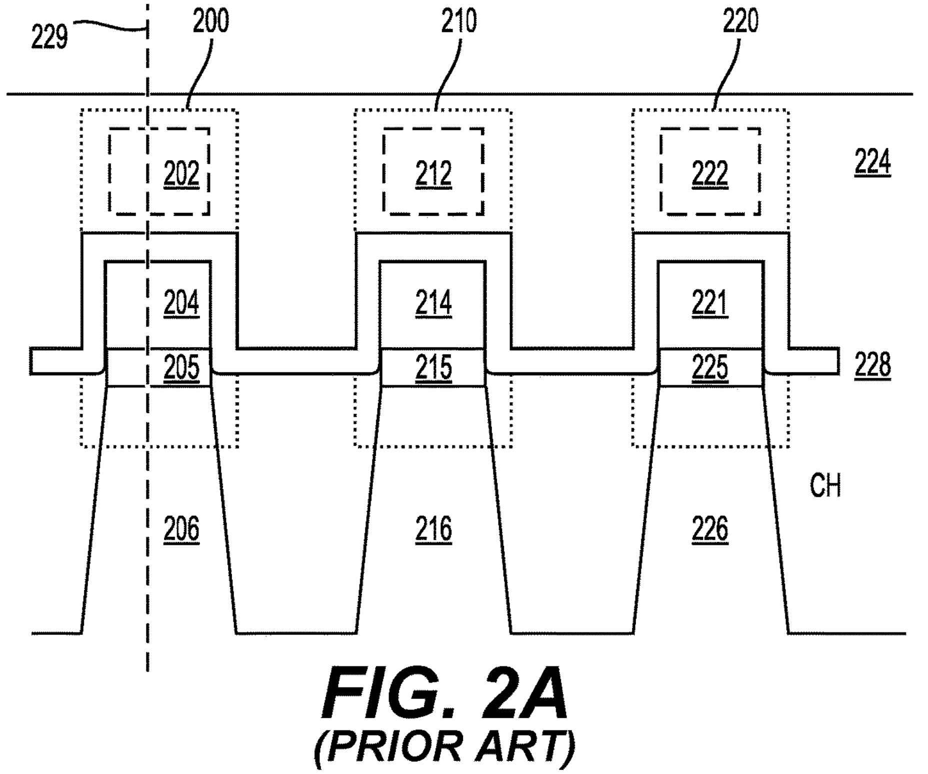
FIG. 2A (PRIOR ART)
FIG. 2A and FIG. 2B depict cross-sectional views of example floating gate memory cells in NAND strings.
Figure 2B:
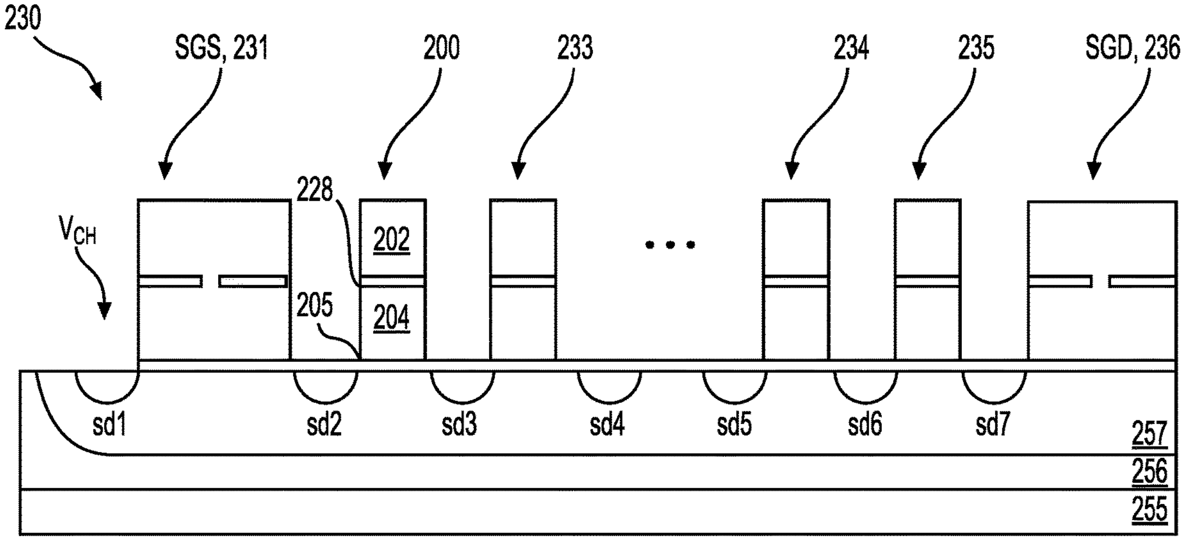
FIG. 2B (PRIOR ART)

One type of non-volatile memory which may be provided in the memory array is a floating gate memory, such as of the type shown in FIGS. 2A and 2B. However, other types of non-volatile memory can also be used. As discussed in further detail below, in another example shown in FIGS. 3A and 3B, a charge-trapping memory cell uses a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The memory cell is programmed by injecting electrons from the cell channel into the nitride, where they are trapped and stored in a limited region. This stored charge then changes the threshold voltage Vt of a portion of the channel of the cell in a manner that is detectable. The memory cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit is localized in the dielectric layer adjacent to the source. Multi-state data storage is obtained by separately reading binary states of the spatially separated charge storage regions within the dielectric. Other types of non-volatile memory are also known.

FIG. 2A illustrates a cross-sectional view of example floating gate memory cells 200, 210, 220 in NAND strings. In this Figure, a bit line or NAND string direction goes into the page, and a word line direction goes from left to right. As an example, word line 224 extends across NAND strings which include respective channel regions 206, 216 and 226. The memory cell 200 includes a control gate 202, a floating gate 204, a tunnel oxide layer 205 and the channel region 206. The memory cell 210 includes a control gate 212, a floating gate 214, a tunnel oxide layer 215 and the channel region 216. The memory cell 220 includes a control gate 222, a floating gate 221, a tunnel oxide layer 225 and the channel region 226. Each memory cell 200, 210, 220 is in a different respective NAND string. An inter-poly dielectric (IPD) layer 228 is also illustrated. The control gates 202, 212, 222 are portions of the word line. A cross-sectional view along contact line connector 229 is provided in FIG. 2B.

The control gate 202, 212, 222 wraps around the floating gate 204, 214, 221, increasing the surface contact area between the control gate 202, 212, 222 and floating gate 204, 214, 221. This results in higher IPD capacitance, leading to a higher coupling ratio which makes programming and erase easier. However, as NAND memory devices are scaled down, the spacing between neighboring cells 200, 210, 220 becomes smaller so there is almost no space for the control gate 202, 212, 222 and the IPD layer 228 between two adjacent floating gates 202, 212, 222.

Figure 3A:
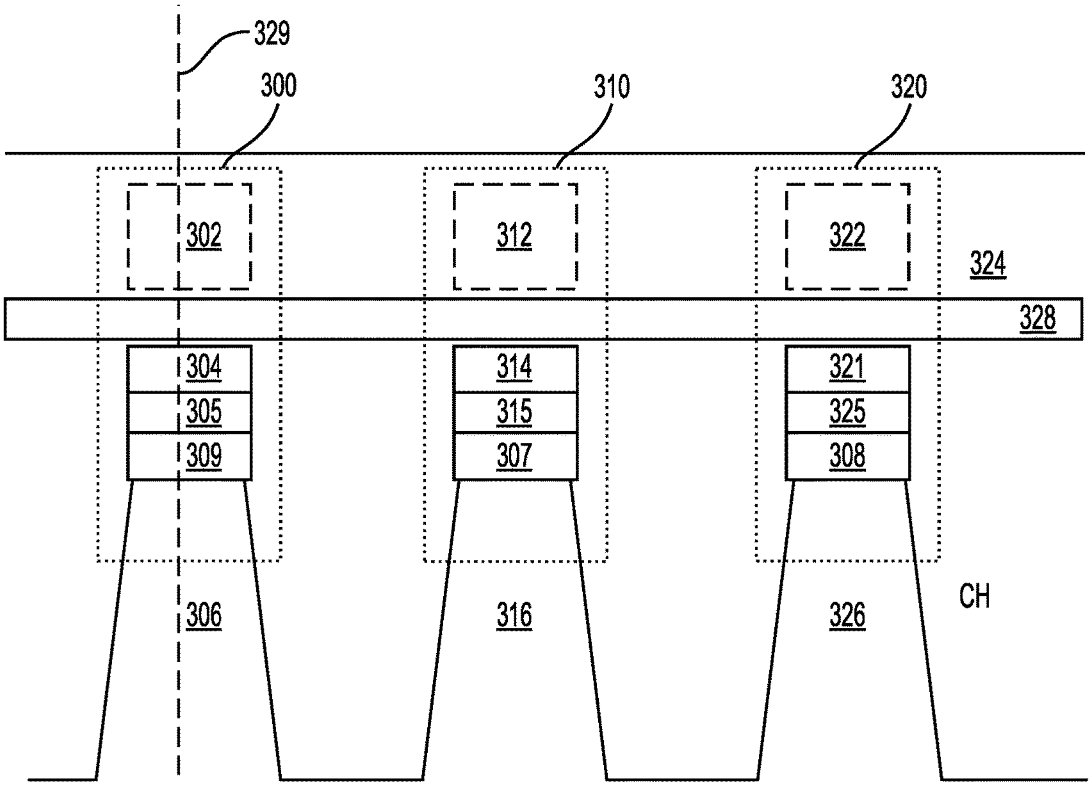
FIG.3A (PRIOR ART)
FIG. 3A and FIG. 3B depict cross-sectional views of example charge-trapping memory cells in NAND strings.
Figure 3B:
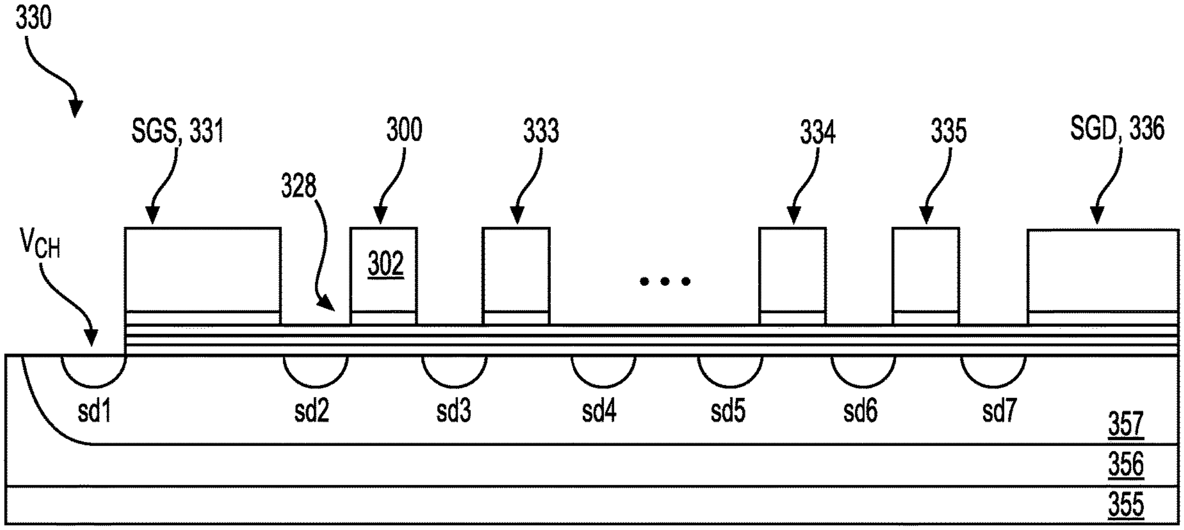
FIG.3B (PRIOR ART)

As an alternative, as shown in FIGS. 3A and 3B, the flat or planar memory cell 300, 310, 320 has been developed in which the control gate 302, 312, 322 is flat or planar; that is, it does not wrap around the floating gate and its only contact with the IPD layer 328 is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

FIG. 3A depicts a cross-sectional view of example charge-trapping memory cells 300, 310, 320 in NAND strings. The view is in a word line direction of memory cells 300, 310, 320 comprising a flat control gate and charge-trapping regions as a two-dimensional example of memory cells 300, 310, 320 in the memory cell array 126. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line 324 extends across NAND strings which include respective channel regions 306, 316, 326. Portions of the word line provide control gates 302, 312, 322. Below the word line is an IPD layer 328, charge-trapping layers 304, 314, 321, polysilicon layers 305, 315, 325, and tunneling layers 309, 307, 308. Each charge-trapping layer 304, 314, 321 extends continuously in a respective NAND string. The flat configuration of the control gate can be made thinner than a floating gate. Additionally, the memory cells can be placed closer together.

FIG. 3B illustrates a cross-sectional view of the structure of FIG. 3A along contact line connector 329. The NAND string 330 includes an SGS transistor 331, example memory cells 300, 333, . . . 335, and an SGD transistor 336. Passageways in the IPD layer 328 in the SGS and SGD transistors 331, 336 allow the control gate layers 302 and floating gate layers to communicate. The control gate 302 and floating gate layers may be polysilicon and the tunnel oxide layer may be silicon oxide, for instance. The IPD layer 328 can be a stack of nitrides (N) and oxides (O) such as in a N—O—N—O—N configuration.

The NAND string may be formed on a substrate which comprises a p-type substrate region 355, an n-type well 356 and a p-type well 357. N-type source/drain diffusion regions sd1, sd2, sd3, sd4, sd5, sd6 and sd7 are formed in the p-type well. A channel voltage, Vch, may be applied directly to the channel region of the substrate.

Figure 4:
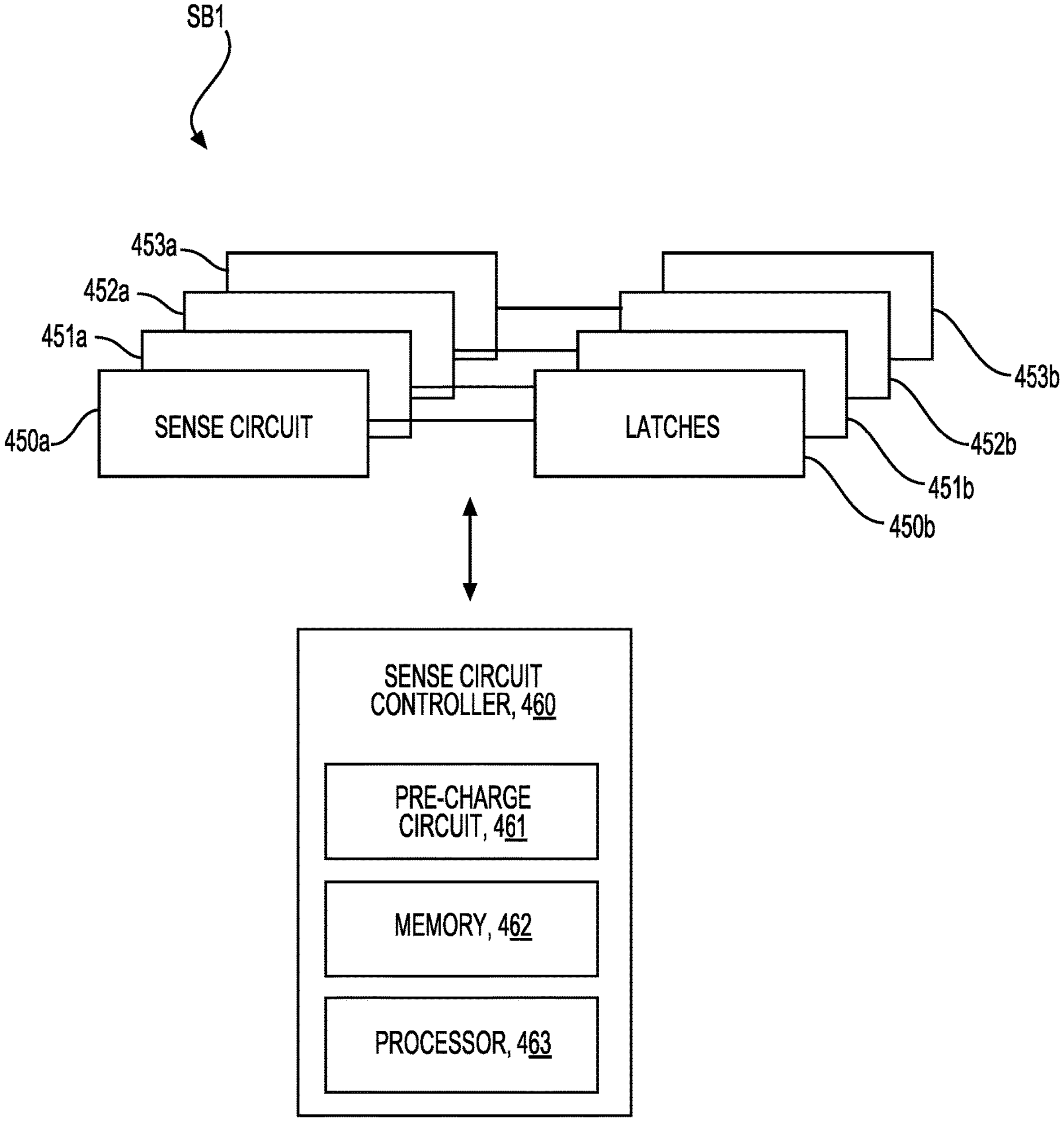
FIG. 4 depicts an example block diagram of a sense block SB1.

FIG. 4 illustrates an example block diagram of a sense block SB1 in a memory chip. In one approach, a sense block comprises multiple sense circuits. Each sense circuit is associated with data latches. For example, the example sense circuits 450*a*, 451*a*, 452*a*, and 453*a* are associated with the data latches 450*b*, 451*b*, 452*b*, and 453*b*, respectively. In one approach, different subsets of bit lines can be sensed using different respective sense blocks. This allows the processing load which is associated with the sense circuits to be divided up and handled by a respective processor in each sense block. For example, a sense circuit controller 460 in SB1 can communicate with the set of sense circuits and latches. The sense circuit controller 460 may include a pre-charge circuit 461 which provides a voltage to each sense circuit for setting a pre-charge voltage. In one possible approach, the voltage is provided to each sense circuit independently, e.g., via the data bus and a local bus. In another possible approach, a common voltage is provided to each sense circuit concurrently. The sense circuit controller 460 may also include a pre-charge circuit 461, a memory 462 and a processor 463. The memory 462 may store code which is executable by the processor to perform the functions described herein. These functions can include reading the latches 450*b*, 451*b*, 452*b*, 453*b* which are associated with the sense circuits 450*a*, 451*a*, 452*a*, 453*a*, setting bit values in the latches and providing voltages for setting pre-charge levels in sense nodes of the sense circuits 450*a*, 451*a*, 452*a*, 453*a*. Further example details of the sense circuit controller 460 and the sense circuits 450*a*, 451*a*, 452*a*, 453*a* are provided below.

In some embodiments, a memory cell may include a flag register that includes a set of latches storing flag bits. In some embodiments, a quantity of flag registers may correspond to a quantity of data states. In some embodiments, one or more flag registers may be used to control a type of verification technique used when verifying memory cells. In some embodiments, a flag bit's output may modify associated logic of the device, e.g., address decoding circuitry, such that a specified block of cells is selected. A bulk operation (e.g., an erase operation, etc.) may be carried out using the flags set in the flag register, or a combination of the flag register with the address register, as in implied addressing, or alternatively by straight addressing with the address register alone.

Figure 5A:
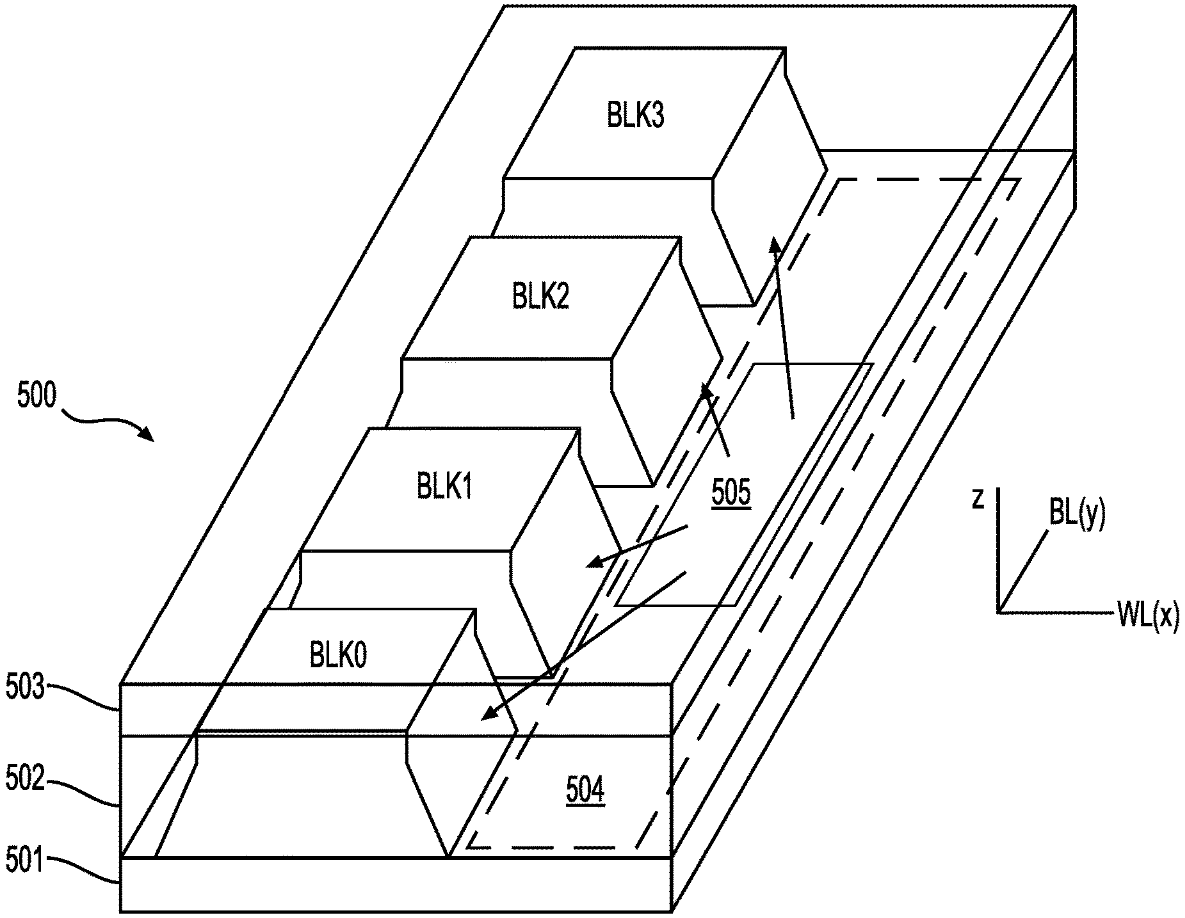
FIG. 5A (PRIOR ART)
FIG. 5A is a perspective view of a set of blocks in an example three-dimensional configuration of a memory array.

FIG. 5A is a perspective view of a set of blocks 500 in an example three-dimensional configuration. On the substrate are example blocks BLK0, BLK1, BLK2, BLK3 of memory cells (storage elements) and a peripheral area 504 with circuitry for use by the blocks BLK0, BLK1, BLK2, BLK3. For example, the circuitry can include voltage drivers 505 which can be connected to control gate layers of the blocks BLK0, BLK1, BLK2, BLK3. In one approach, control gate layers at a common height in the blocks BLK0, BLK1, BLK2, BLK3 are commonly driven. The substrate 501 can also carry circuitry under the blocks BLK0, BLK1, BLK2, BLK3, along with one or more lower metal layers which are patterned in conductive paths to carry signals of the circuitry. The blocks BLK0, BLK1, BLK2, BLK3 are formed in an intermediate region 502 of the memory device. In an upper region 503 of the memory device, one or more upper metal layers are patterned in conductive paths to carry signals of the circuitry. Each block BLK0, BLK1, BLK2, BLK3 comprises a stacked area of memory cells, where alternating levels of the stack represent word lines. In one possible approach, each block BLK0, BLK1, BLK2, BLK3 has opposing tiered sides from which vertical contacts extend upward to an upper metal layer to form connections to conductive paths. While four blocks BLK0, BLK1, BLK2, BLK3 are illustrated as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 5B:
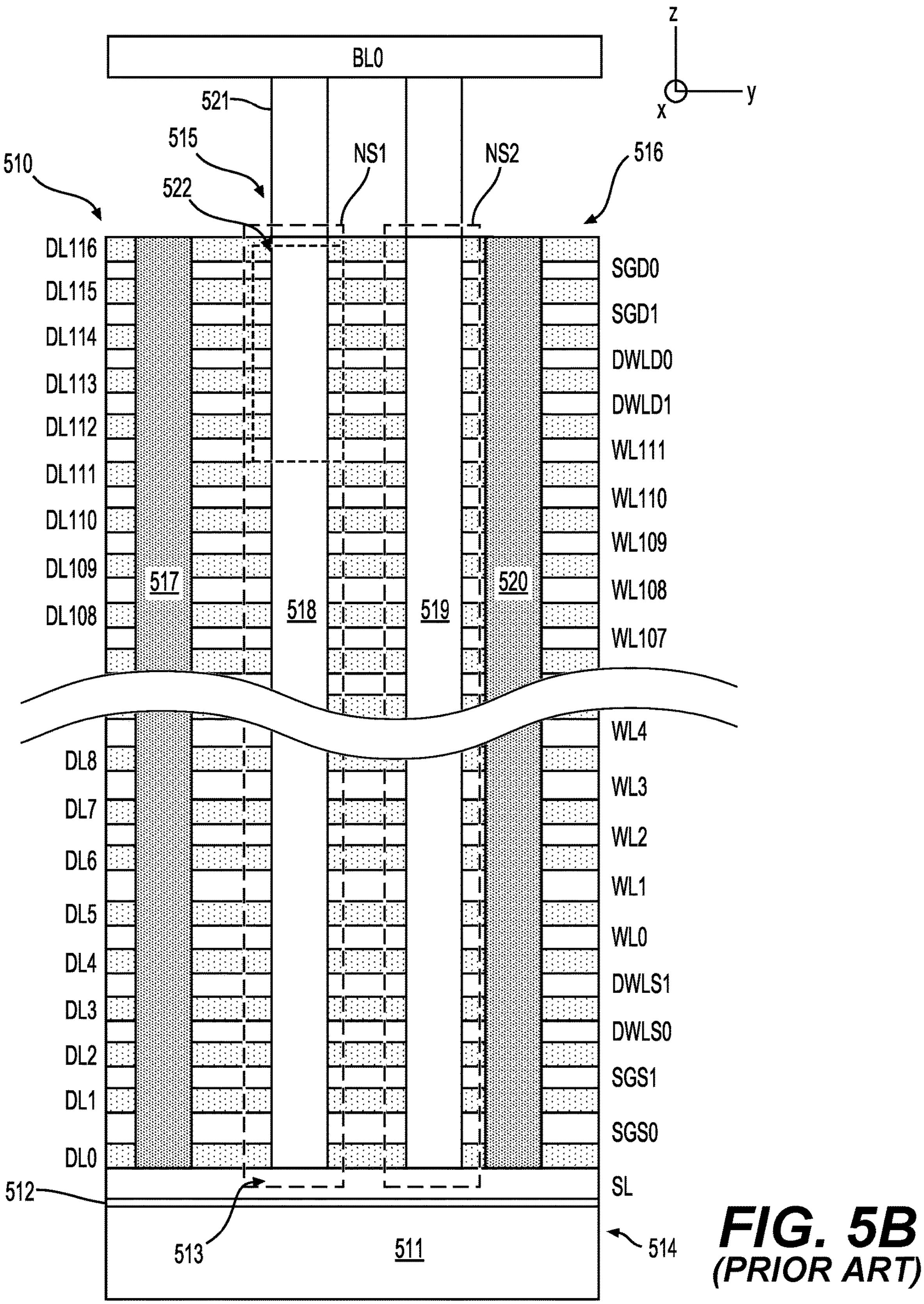
FIG. 5B (PRIOR ART)
FIG. 5B depicts an example cross-sectional view of a portion of one of the blocks of FIG. 5A.

FIG. 5B illustrates an example cross-sectional view of a portion of one of the blocks BLK0, BLK1, BLK2, BLK3 of FIG. 5A. The block comprises a stack 510 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WL0-WL111. The dielectric layers are labelled as DL0-DL116. Further, regions of the stack 510 which comprise NAND strings NS1 and NS2 are illustrated. Each NAND string encompasses a memory hole 518, 519 which is filled with materials which form memory cells adjacent to the word lines. A region 522 of the stack 510 is shown in greater detail in FIG. 5D and is discussed in further detail below.

The stack 510 includes a substrate 511, an insulating film 512 on the substrate 511, and a portion of a source line SL. NS1 has a source-end 513 at a bottom 514 of the stack and a drain-end 515 at a top 516 of the stack 510. Contact line connectors (e.g., slits, such as metal-filled slits) 517, 520 may be provided periodically across the stack 510 as interconnects which extend through the stack 510, such as to connect the source line to a particular contact line above the stack 510. The contact line connectors 517, 520 may be used during the formation of the word lines and subsequently filled with metal. A portion of a bit line BL0 is also illustrated. A conductive via 521 connects the drain-end 515 to BL0.

Figure 5C:
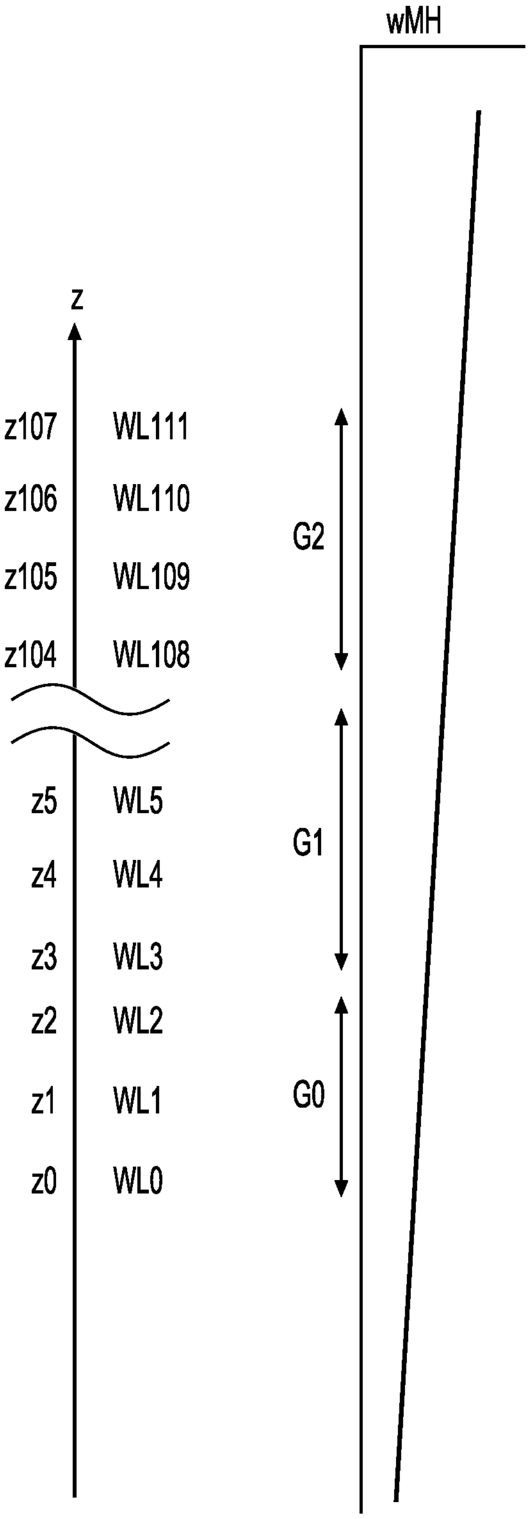
FIG. 5C (PRIOR ART)
FIG. 5C depicts a plot of memory hole diameter of the stack of FIG. 5B.

FIG. 5C illustrates a plot of memory hole diameter in the stack of FIG. 5B. The vertical axis is aligned with the stack of FIG. 5B and illustrates a width (wMH), e.g., diameter, of the memory holes 518 and 519. The word line layers WL0-WL111 of FIG. 5A are repeated as an example and are at respective heights z0-z111 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slightly wider before becoming progressively smaller from the top to the bottom of the memory hole.

Figure 5D:
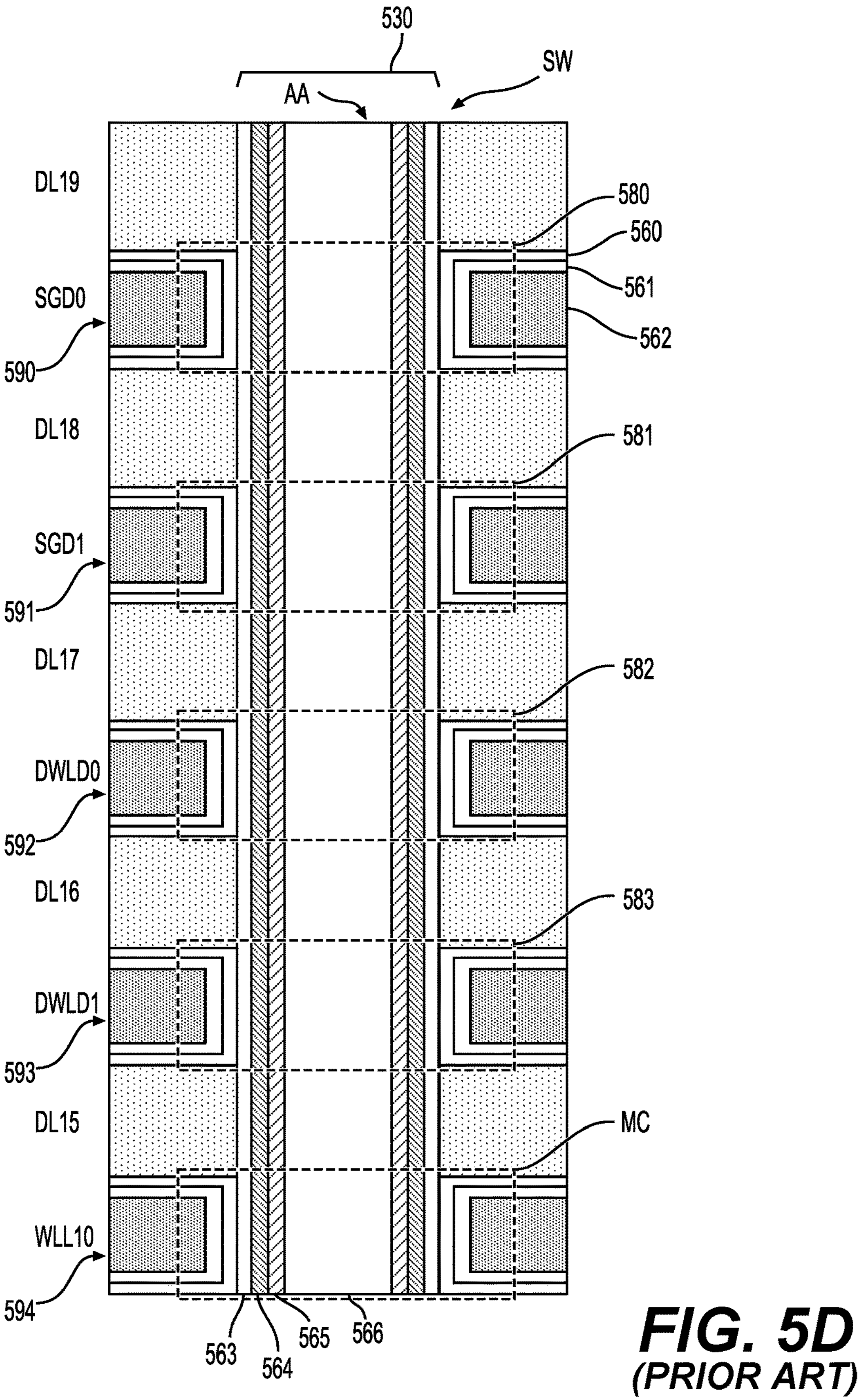
FIG. 5D (PRIOR ART)
FIG. 5D depicts a close-up view of region 522 of the stack of FIG. 5B.

FIG. 5D illustrates a close-up view of the region 522 of the stack 510 of FIG. 5B. Memory cells are formed at the different levels of the stack at the intersection of a word line layer and a memory hole. In this example, SGD transistors 580, 581 are provided above dummy memory cells 582, 583 and a data memory cell MC. A number of layers can be deposited along the sidewall (SW) of the memory hole 530 and/or within each word line layer, e.g., using atomic layer deposition. For example, each column (e.g., the pillar which is formed by the materials within a memory hole 530) can include a charge-trapping layer or film 563 such as SiN or other nitride, a tunneling layer 564, a polysilicon body or channel 565, and a dielectric core 566. A word line layer can include a blocking oxide/block high-k material 560, a metal barrier 561, and a conductive metal 562 such as Tungsten as a control gate. For example, control gates 590, 591, 592, 593, and 594 are provided. In this example, all of the layers except the metal are provided in the memory hole 530. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vt of a memory cell is increased in proportion to the amount of stored charge. During an erase operation, the electrons return to the channel.

Each of the memory holes 530 can be filled with a plurality of annular layers comprising a blocking oxide layer, a charge trapping layer 563, a tunneling layer 564 and a channel layer. A core region of each of the memory holes 530 is filled with a body material, and the plurality of annular layers are between the core region and the word line in each of the memory holes 530.

The NAND string can be considered to have a floating body channel because the length of the channel is not formed on a substrate. Further, the NAND string is provided by a plurality of word line layers above one another in a stack, and separated from one another by dielectric layers.

Figure 6A:
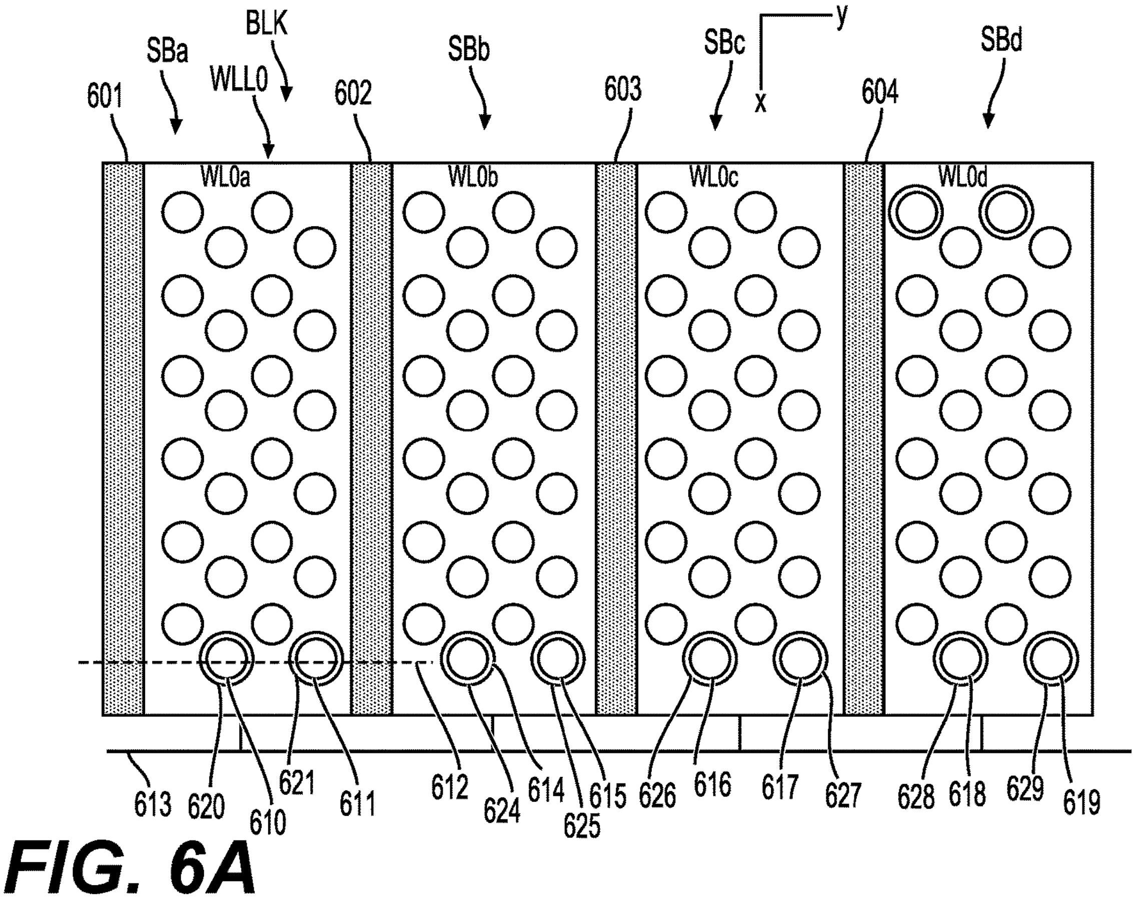
FIG. 6A (PRIOR ART)
FIG. 6A depicts a top view of an example word line layer WL0 of the stack of FIG. 5B.

FIG. 6A illustrates a top view of an example word line layer WL0 of the stack 510 of FIG. 5B. As mentioned, a three-dimensional memory device can comprise a stack of alternating conductive and dielectric layers. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a three-dimensional memory device can be divided into sub-blocks, where each sub-block comprises a NAND string group which has a common SGD control line. For example, see the SGD lines/control gates SGD0, SGD1, SGD2 and SGD3 in the sub-blocks SBa, SBb, SBc and SBd, respectively. Further, a word line layer in a block can be divided into regions. Each region is in a respective sub-block and can extend between contact line connectors (e.g., slits) which are formed periodically in the stack to process the word line layers during the fabrication process of the memory device. This processing can include replacing a sacrificial material of the word line layers with metal. Generally, the distance between contact line connectors should be relatively small to account for a limit in the distance that an etchant can travel laterally to remove the sacrificial material, and that the metal can travel to fill a void which is created by the removal of the sacrificial material. For example, the distance between contact line connectors may allow for a few rows of memory holes between adjacent contact line connectors. The layout of the memory holes and contact line connectors should also account for a limit in the number of bit lines which can extend across the region while each bit line is connected to a different memory cell. After processing the word line layers, the contact line connectors can optionally be filed with metal to provide an interconnect through the stack.

Figure 6B:
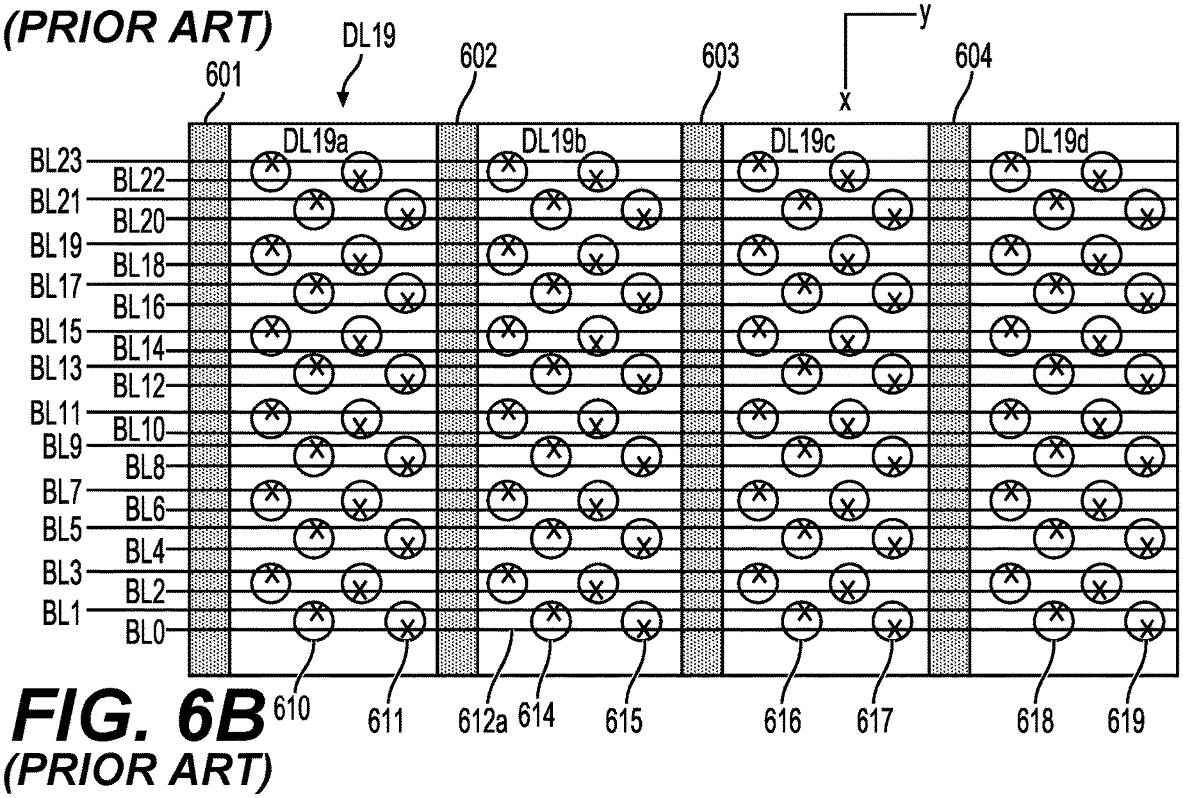
FIG. 6B (PRIOR ART)
FIG. 6B depicts a top view of an example top dielectric layer DL116 of the stack of FIG. 5B.

In this example, there are four rows of memory holes between adjacent contact line connectors. A row here is a group of memory holes which are aligned in the x-direction. Moreover, the rows of memory holes are in a staggered pattern to increase the density of the memory holes. The word line layer or word line is divided into regions WL0*a*, WL0*b*, WL0*c* and WL0*d* which are each connected by a contact line 613. The last region of a word line layer in a block can be connected to a first region of a word line layer in a next block, in one approach. The contact line 613, in turn, is connected to a voltage driver for the word line layer. The region WL0*a* has example memory holes 610, 611 along a contact line 612. The region WL0*b* has example memory holes 614, 615. The region WL0*c* has example memory holes 616, 617. The region WL0*d* has example memory holes 618, 619. The memory holes are also shown in FIG. 6B. Each memory hole can be part of a respective NAND string. For example, the memory holes 610, 614, 616 and 618 can be part of NAND strings NS0_SBa, NS1_SBb, NS2_SBc, NS3_SBd, and NS4_SBe, respectively.

Each circle represents the cross-section of a memory hole at a word line layer or SG layer. Example circles shown with dashed lines represent memory cells which are provided by the materials in the memory hole and by the adjacent word line layer. For example, memory cells 620, 621 are in WL0*a*, memory cells 624, 625 are in WL0*b*, memory cells 626, 627 are in WL0*c*, and memory cells 628, 629 are in WL0*d*. These memory cells are at a common height in the stack.

Contact line connectors (e.g., slits, such as metal-filled slits) 601, 602, 603, 604 may be located between and adjacent to the edges of the regions WL0*a*-WL0*d*. The contact line connectors 601, 602, 603, 604 provide a conductive path from the bottom of the stack to the top of the stack. For example, a source line at the bottom of the stack may be connected to a conductive line above the stack, where the conductive line is connected to a voltage driver in a peripheral region of the memory device.

FIG. 6B illustrates a top view of an example top dielectric layer DL116 of the stack of FIG. 5B. The dielectric layer is divided into regions DL116*a*, DL116*b*, DL116*c* and DL116*d*. Each region can be connected to a respective voltage driver. This allows a set of memory cells in one region of a word line layer being programmed concurrently, with each memory cell being in a respective NAND string which is connected to a respective bit line. A voltage can be set on each bit line to allow or inhibit programming during each program voltage.

The region DL116*a* has the example memory holes 610, 611 along a contact line 612, which is coincident with a bit line BL0. A number of bit lines extend above the memory holes and are connected to the memory holes as indicated by the "X" symbols. BL0 is connected to a set of memory holes which includes the memory holes 611, 615, 617, 619. Another example bit line BL1 is connected to a set of memory holes which includes the memory holes 610, 614, 616, 618. The contact line connectors (e.g., slits, such as metal-filled slits) 601, 602, 603, 604 from FIG. 6A are also illustrated, as they extend vertically through the stack. The bit lines can be numbered in a sequence BL0-BL23 across the DL116 layer in the x-direction.

Different subsets of bit lines are connected to memory cells in different rows. For example, BL0, BL4, BL8, BL12, BL16, BL20 are connected to memory cells in a first row of cells at the right-hand edge of each region. BL2, BL6, BL10, BL14, BL18, BL22 are connected to memory cells in an adjacent row of cells, adjacent to the first row at the right-hand edge. BL3, BL7, BL11, BL15, BL19, BL23 are connected to memory cells in a first row of cells at the left-hand edge of each region. BL1, BL5, BL9, BL13, BL17, BL21 are connected to memory cells in an adjacent row of memory cells, adjacent to the first row at the left-hand edge.

Figure 7:
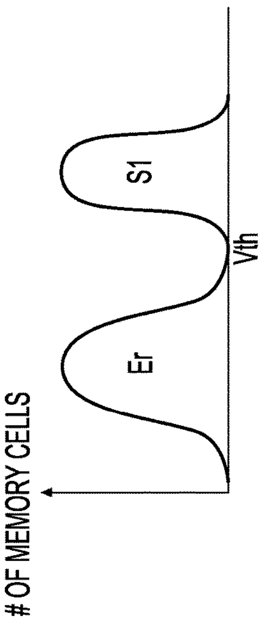
FIG. 7 (PRIOR ART)
FIG. 7 depicts a threshold voltage distribution of a page of memory cells programmed to one bit per memory cell (SLC)
Figure 8:
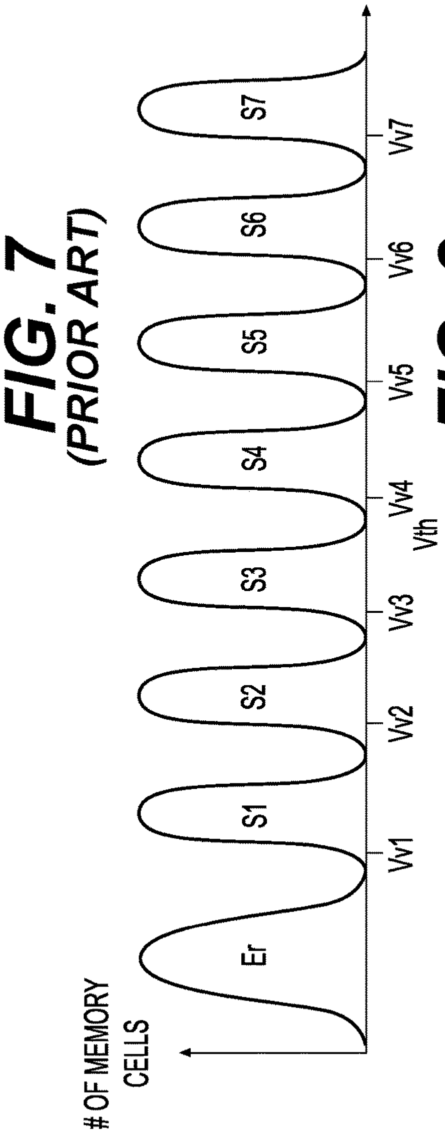
FIG. 8 (PRIOR ART)
FIG. 8 depicts a threshold voltage distribution of a page of memory cells programmed to three bits per memory cell (TLC)
Figure 9:
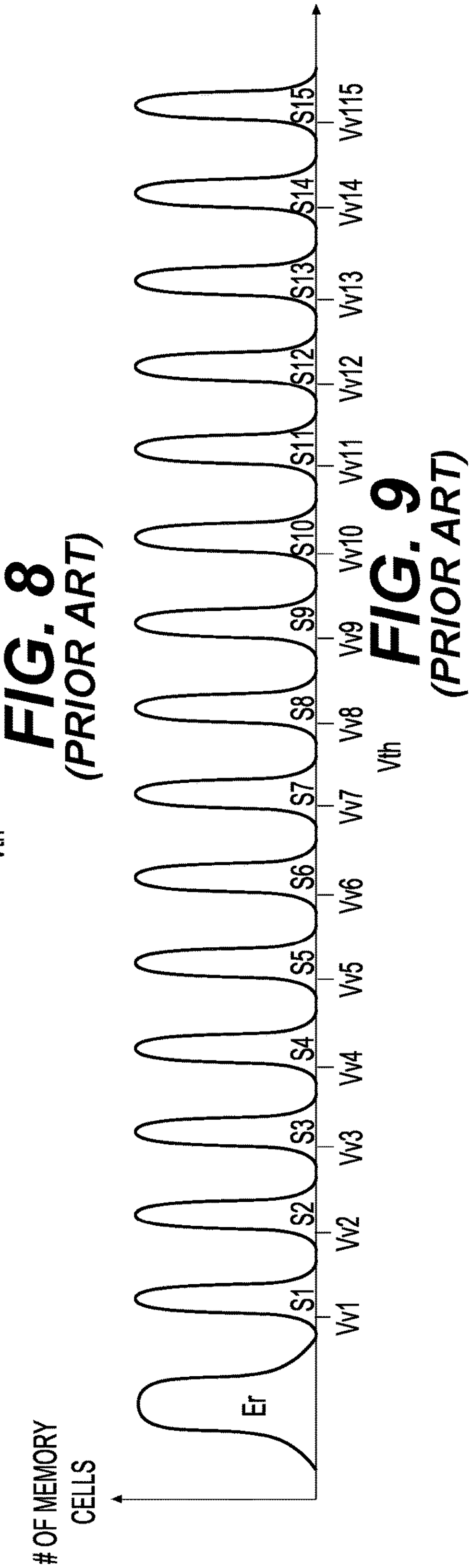
FIG. 9 (PRIOR ART)
FIG. 9 depicts a threshold voltage distribution of a page of memory cells programmed to four bits per memory cell (QLC)

The memory cells of the memory blocks can be programmed to retain one or more bits of data in multiple data states, each of which is associated with a respective threshold voltage Vt range. For example, FIG. 7 depicts a threshold voltage Vt distribution of a group of memory cells programmed according to a one bit per memory cell (SLC) storage scheme. In the SLC storage scheme, there are two total data states, including the erased state (Er) and a single programmed data state (S1). FIG. 8 illustrates the threshold voltage Vt distribution of a three bits per cell (TLC) storage scheme that includes eight total data states, namely the erased state (Er) and seven programmed data states (S1, S2, S3, S4, S5, S6, and S7). Each programmed data state (S1-S7) is associated with a respective verify voltage (Vv1-Vv7), which is employed during a verify portion of a programming operation. FIG. 9 depicts a threshold voltage Vt distribution of a four bits per cell (QLC) storage scheme that includes sixteen total data states, namely the erased state (Er) and fifteen programmed data states (S1-S15). Other storage schemes are also available, such as two bits per cell (MLC) with four data states or five bits per cell (PLC) with thirty-two data states. Generally, programming a fixed amount of data into memory cells at a higher number of bits per memory cell (such as TLC or QLC) requires more time than programming the same amount of data into more memory cells at a reduced number of bits per cell. In other words, there is a tradeoff between programming high speed (performance) and programming at high density. Also, programming to TLC or QLC stresses the memory cells more than programming to SLC, and therefore, the endurance (as measured in terabytes written [TBW]) of a memory device programming to SLC is generally greater than the endurance of a memory device programming to TLC or QLC.

Figure 10A:
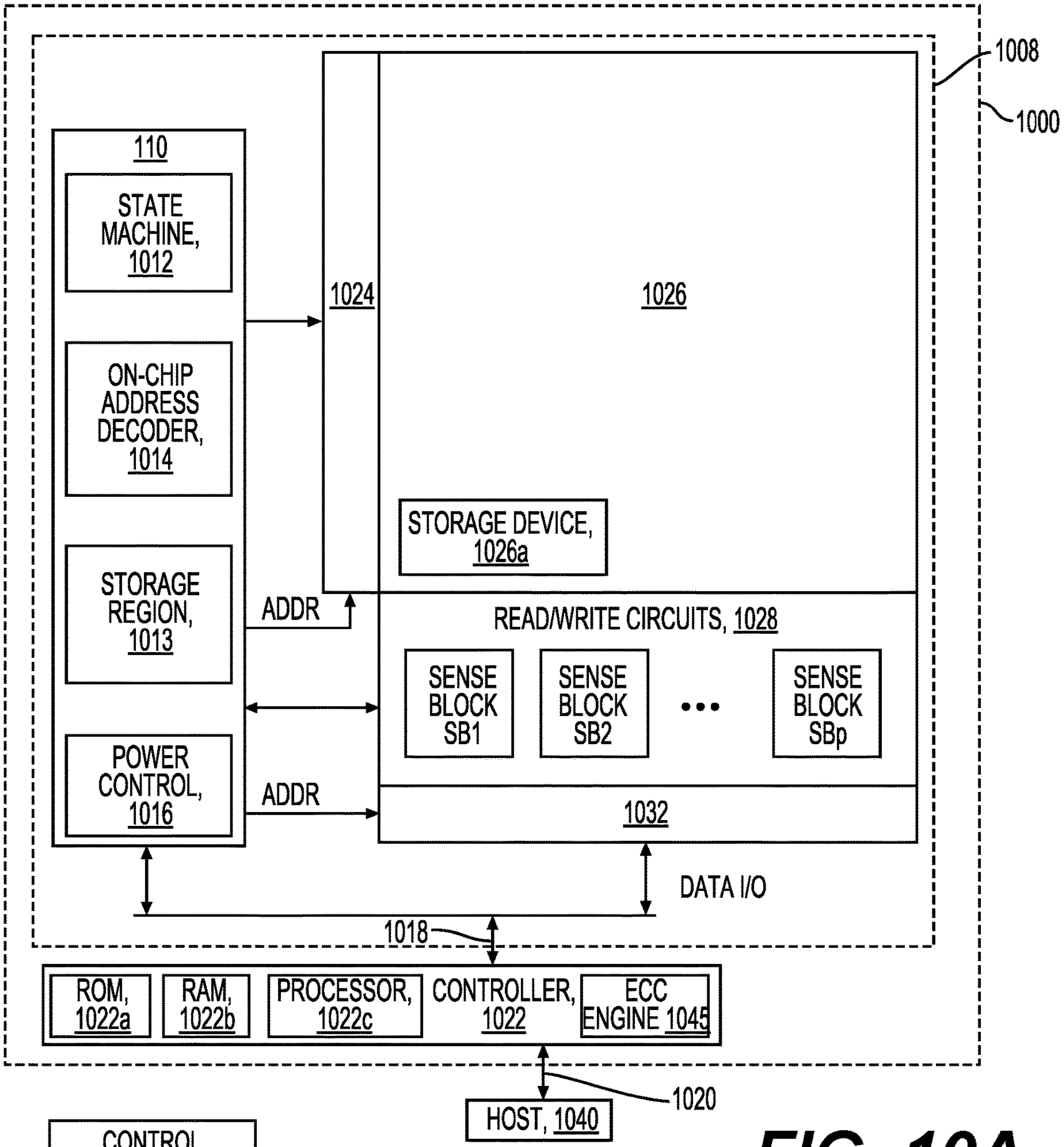
FIG. 10A is a block diagram of an example memory device configured to implement neighbor plane disturb (NPD) techniques according to the principles of the present disclosure.

FIG. 10A is a block diagram of an example memory device 1000 that is configured to operate according to NPD detection techniques of the present disclosure. The memory die 1008 includes a memory structure 1026 of memory cells arranged in word lines, such as an array of memory cells, control circuitry 1010, and read/write circuits 1028. The memory structure 1026 is addressable by word lines via a row decoder 1024 and by bit lines via a column decoder 1032. The read/write circuits 1028 include multiple sense blocks SB1, SB2, . . . . SBp (sensing circuitry) and allow a page of memory cells to be read or programmed in parallel. A controller 1022 may be included in the same memory device 1000 (e.g., a removable storage card) as the one or more memory die 1008. Commands and data are transferred between the host 1040 and controller 1022 via a data bus 1020, and between the controller and the one or more memory die 1008 via lines 1018. In some examples, the controller 1022 is configured to perform all or portions of the NPD detection techniques during a multi-plane programming (i.e., write) operation of the present disclosure. Control circuitry 1010 may also be configured to perform all or portions of the NPD detection techniques during a multi-plane programming operation of the present disclosure.

The memory structure 1026 can be two-dimensional or three-dimensional. The memory structure 1026 may comprise one or more array of memory cells including a three-dimensional array. The memory structure 1026 may comprise a monolithic three-dimensional memory structure in which multiple memory levels are formed above (and not in) a single substrate, such as a wafer, with no intervening substrates. The memory structure 1026 may comprise any type of non-volatile memory that is monolithically formed in one or more physical levels of arrays of memory cells having an active area disposed above a silicon substrate. The memory structure 1026 may be in a non-volatile memory device having circuitry associated with the operation of the memory cells, whether the associated circuitry is above or within the substrate.

The control circuitry 1010 cooperates with the read/write circuits 1028 to perform memory operations on the memory structure 1026, and includes a state machine 1012, an on-chip address decoder 1014, and a power control module 1016. The state machine 1012 provides chip-level control of memory operations. As discussed in further detail below, the control circuitry 1010 is configured to operate the memory device 1000 according to the NPD detection techniques of the present disclosure.

Turning back to FIG. 10A, a storage region 1013 may, for example, be provided for programming parameters. The programming parameters may include a program voltage, a program voltage bias, position parameters indicating positions of memory cells, contact line connector thickness parameters, a verify voltage, and/or the like. The position parameters may indicate a position of a memory cell within the entire array of NAND strings, a position of a memory cell as being within a particular NAND string group, a position of a memory cell on a particular plane, and/or the like. The contact line connector thickness parameters may indicate a thickness of a contact line connector, a substrate or material that the contact line connector is comprised of, and/or the like.

The on-chip address decoder 1014 provides an address interface that is used by the host or a memory controller to determine the hardware address used by the decoders 1024 and 1032. The power control module 1016 controls the power and voltages supplied to the word lines and bit lines during memory operations. It can include drivers for word lines, SGS and SGD transistors, and source lines. The sense blocks can include bit line drivers, in one approach. An SGS transistor is a select gate transistor at a source end of a NAND string, and an SGD transistor is a select gate transistor at a drain end of a NAND string.

In some embodiments, some of the components can be combined. In various designs, one or more of the components (alone or in combination), other than memory structure 1026, can be thought of as at least one control circuit which is configured to perform the actions described herein. For example, a control circuit may include any one of, or a combination of, control circuitry 1010, state machine 1012, decoders 1014/1032, power control module 1016, sense blocks SBb, SB2, . . . , SBp, read/write circuits 1028, controller 1022, and so forth.

Figure 10B:
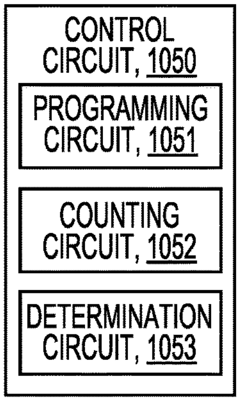
FIG. 10B is a block diagram of an example control circuit implemented by the memory device of FIG. 10A.

The control circuits can include a programming circuit configured to perform a program and verify operation for one set of memory cells, wherein the one set of memory cells comprises memory cells assigned to represent one data state among a plurality of data states and memory cells assigned to represent another data state among the plurality of data states; the program and verify operation comprising a plurality of program and verify iterations; and in each program and verify iteration, the programming circuit performs programming for the one selected word line after which the programming circuit applies a verification signal to the selected word line. The control circuits can also include a counting circuit configured to obtain a count of memory cells which pass a verify test for the one data state. The control circuits can also include a determination circuit configured to determine, based on an amount by which the count exceeds a threshold, whether a programming operation is completed. For example, FIG. 10B is a block diagram of an example control circuit 1050 which comprises a programming circuit 1051, a counting circuit 1052, and a determination circuit 1053. The control circuit 1050 may be configured to perform all or portions of the NPD detection techniques during a multi-plane programming operation of the present disclosure.

The controller 1022 may comprise a processor 1022*c*, storage devices (memory) such as ROM 1022*a* and RAM 1022*b* and an error-correction code (ECC) engine 1045. The ECC engine can correct a number of read errors which are caused when the upper tail of a Vth distribution becomes too high. However, uncorrectable errors may exist in some cases. The techniques provided herein reduce the likelihood of uncorrectable errors.

The storage device(s) 1022*a*, 1022*b* comprise, code such as a set of instructions, and the processor 1022*c* is operable to execute the set of instructions to provide the functionality described herein. Alternately or additionally, the processor 1022*c* can access code from a storage device 1026*a* of the memory structure 1026, such as a reserved area of memory cells in one or more word lines. For example, code can be used by the controller 1022 to access the memory structure 1026 such as for programming, read, and erase operations. The code can include boot code and control code (e.g., set of instructions). The boot code is software that initializes the controller 1022 during a booting or startup process and enables the controller 1022 to access the memory structure 1026. The code can be used by the controller 1022 to control one or more memory structures 1026. Upon being powered up, the processor 1022*c* fetches the boot code from the ROM 1022*a* or storage device 1026*a* for execution, and the boot code initializes the system components and loads the control code into the RAM 1022*b*. Once the control code is loaded into the RAM 1022*b*, it is executed by the processor 1022*c*. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple memory strings in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured. The semiconductor memory elements located within and/or over a substrate may be arranged in two or three dimensions, such as a two-dimensional memory structure or a three-dimensional memory structure.

In a two-dimensional memory structure, the semiconductor memory elements are arranged in a single plane or a single memory device level. Typically, in a two-dimensional memory structure, memory elements are arranged in a plane (e.g., in an x-y direction plane) which extends substantially parallel to a major surface of a substrate that supports the memory elements. The substrate may be a wafer over or in which the layer of the memory elements is formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three-dimensional memory array is arranged so that memory elements occupy multiple planes or multiple memory device levels, thereby forming a structure in three dimensions (i.e., in the x, y and z directions, where the z-direction is substantially perpendicular and the x- and y-directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory elements. The columns may be arranged in a two-dimensional configuration, e.g., in an x-y plane, resulting in a three-dimensional arrangement of memory elements with elements on multiple vertically stacked memory planes. Other configurations of memory elements in three dimensions can also constitute a three-dimensional memory array.

By way of non-limiting example, in a three-dimensional array of NAND strings, the memory elements may be coupled together to form a NAND string within a single horizontal (e.g., x-y) memory device level. Alternatively, the memory elements may be coupled together to form a vertical NAND string that traverses across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

Typically, in a monolithic three-dimensional memory array, one or more memory device levels are formed above a single substrate. Optionally, the monolithic three-dimensional memory array may also have one or more memory layers at least partially within the single substrate. As a non-limiting example, the substrate may include a semiconductor such as silicon. In a monolithic three-dimensional array, the layers constituting each memory device level of the array are typically formed on the layers of the underlying memory device levels of the array. However, layers of adjacent memory device levels of a monolithic three-dimensional memory array may be shared or have intervening layers between memory device levels.

In other examples, two-dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three-dimensional memory arrays. Further, multiple two-dimensional memory arrays or three-dimensional memory arrays (monolithic or non-monolithic) may be formed on separate chips and then packaged together to form a stacked-chip memory device.

The memory cells of a memory block are typically programmed by applying a voltage differential between a word line of a memory cell and a bit line coupled to the same memory cell, thereby causing electrons to tunnel into the floating gate of that memory cell and causing a threshold voltage of the memory cell to increase. Programming typically occurs sequentially from one word line to another across a memory block or sub-block. In other words, programming occurs with one word line at a time.

Figure 11:
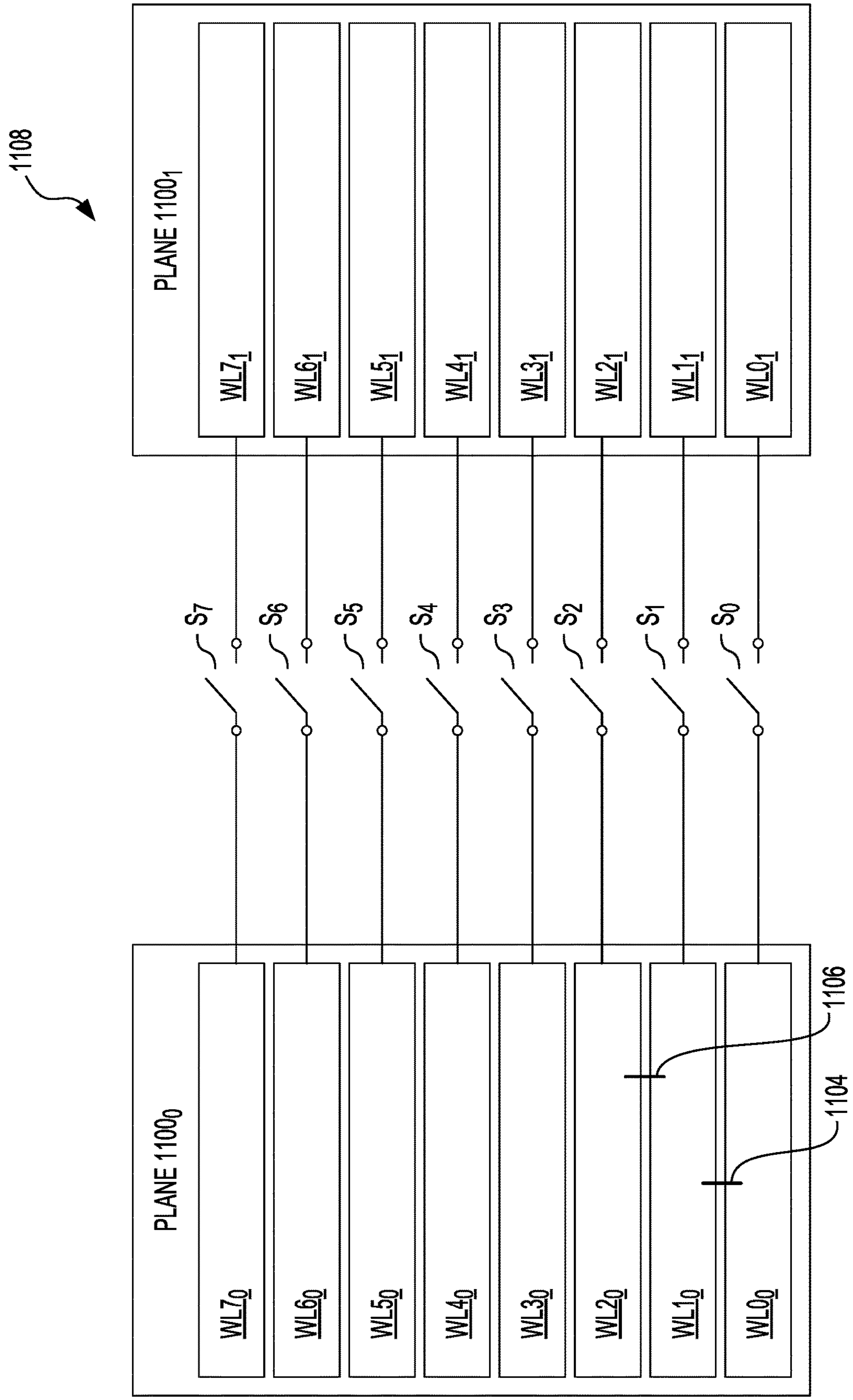
FIG. 11 a block diagram of an example simplified multi-plane organization of a memory structure.

In multi-plane programming, a memory structure is divided into multiple planes and memory cells in multiple planes connected to the same word lines may be programmed concurrently. FIG. 11 is a block diagram depicting a simplified multi-plane organization of a memory structure divided into a first plane 11000 and a second plane 11001 located on a same memory die (e.g., die 1008 of FIG. 10A). The first plane 11000 includes eight word lines WL0 0, WL1 0, WL2 0, . . . , WL7 0 and the second plane 11001 includes eight word lines WL0 1, WL1 1, WL2 1, . . . , WL7 1. In other embodiments, first plane 11000 and the second plane 11001 each may include more or fewer than eight word lines.

Switches S0, S1, . . . , S7 may be used to selectively couple word lines WL0 0, WL1 0, . . . , WL7 0 on the first plane $1100_0$ to corresponding word line WL0 1, WL2 1, . . . , WL7 1 on the second plane $1100_1$. In multi-plane programming, switch S0 closes to couple word lines WL0 0 and WL0 1, switch S1 closes to couple word lines WL1 0 and WL1 1, switch S2 closes to selectively couple word lines WL2 0 and WL2 1, and so on.

In the illustrated example, as a result of a manufacturing defect, a first word line-to-word line short 1104 exists between word line WL0 0 and word line WL1 0, and a second word line-to-word line short 1106 exists between word line WL1 0 and word line WL2 0. In this example, the manufacturing defects are only on word lines in the first plane $1100_0$. No word line-to-word line shorts exist on the second plane $1100_1$. In other instances, manufacturing defects may exist only in the second plane $1100_1$, or in both the first plane $1100_0$ and the second plane $1100_1$.

During programming, one or more programming pulses are applied to word lines WL0 0 and WL0 1, one or more programming pulses are applied to word lines WL1 0 and WL1 1, one or more programming pulses are applied to word lines WL2 0 and WL2 1, and so on. As a result of first word line-to word line short 1104 and second word line-to word line short 1106, programming of memory cells coupled to word line WL0 0 fails because the voltage of word line WL0 0 is pulled down by shorted word lines WL1 0 and WL2 0.

In particular, word line WL0 0 is unable to reach a high enough voltage level to successfully program memory cells coupled to word line WL0 0 before a maximum number of program loops is reached. First word line-to word line short 1104 and second word line-to word line short 1106 cause the same failure to occur while attempting to program memory cells coupled to word lines WL1 0 and WL2 0.

Although no word line-to-word line shorts exist in the second plane $\mathbf{1100}_1$, switches S0, S1, . . . , S7 couple corresponding word lines on the first plane $\mathbf{1100}_0$ and the second plane $\mathbf{1100}_1$. Accordingly, because the voltage of WL0 0 is pulled down by shorted word lines WL1 0 and WL2 0, coupled word line WL0 1 also is unable to reach a high enough voltage level to successfully program memory cells coupled to word line WL0 1 before the maximum number of program loops is reached. Likewise, the same failure occurs while attempting to program memory cells coupled to word lines WL1 1 and WL2 1.

This phenomenon is sometimes referred to as "neighbor plane disturb," or "NPD." In such a scenario, the first plane $\mathbf{1100}_0$ is sometimes referred to as the "attacker block," and the second plane $\mathbf{1100}_1$ is sometimes referred to as the "victim block" because word line defects on the first plane $\mathbf{1100}_0$ disturb programming of coupled word lines of the second plane $\mathbf{1100}_1$.

NPD causes higher defective parts per million (DPPM) because NPD generally leads to victim block UECC (uncorrectable by error correction code) failure, and results in data loss, which is difficult to overcome. One approach to address NPD focuses on reducing defect density from process. Another approach implements an early program termination (EPT) mode. For EPT, a programming operation may be terminated early to minimize the amount of charge that leaks to neighboring planes. For example, if programming loops are limited, programming of a shorted or slow plane will be terminated earlier, resulting in less disturb on neighboring planes.

Various techniques may be used to detect NPD (e.g., to identify planes causing NPD). In an example, a bit scan (BS) technique (e.g., an independent bit scan (IBS) technique) is implemented as an NPD countermeasure. IBS techniques include performing a bit scan on each plane, identifying one or more slow planes (e.g., a slow plane that does not reach an expected programmed state when remaining fast/faster planes have already reached the expected programmed state), and completing programing operations on faster planes regardless of programming success on the one or more slow planes. In the IBS mode, an identified slow plane may be terminated (i.e., programming of the slow plane may be terminated/stopped) by setting a judge state and various criteria states during multi-plane programming operations, which reduces the likelihood that fast planes will be disturbed by slow planes. Example IBS techniques are described in more detail in U.S. patent application Ser. No. 17/353,298 (filed on Jun. 21, 2021) and issued as U.S. Pat. No. 11,605,436 (issued on Mar. 14, 2023), the entire contents of which are incorporated herein by reference.

Figure 12A:
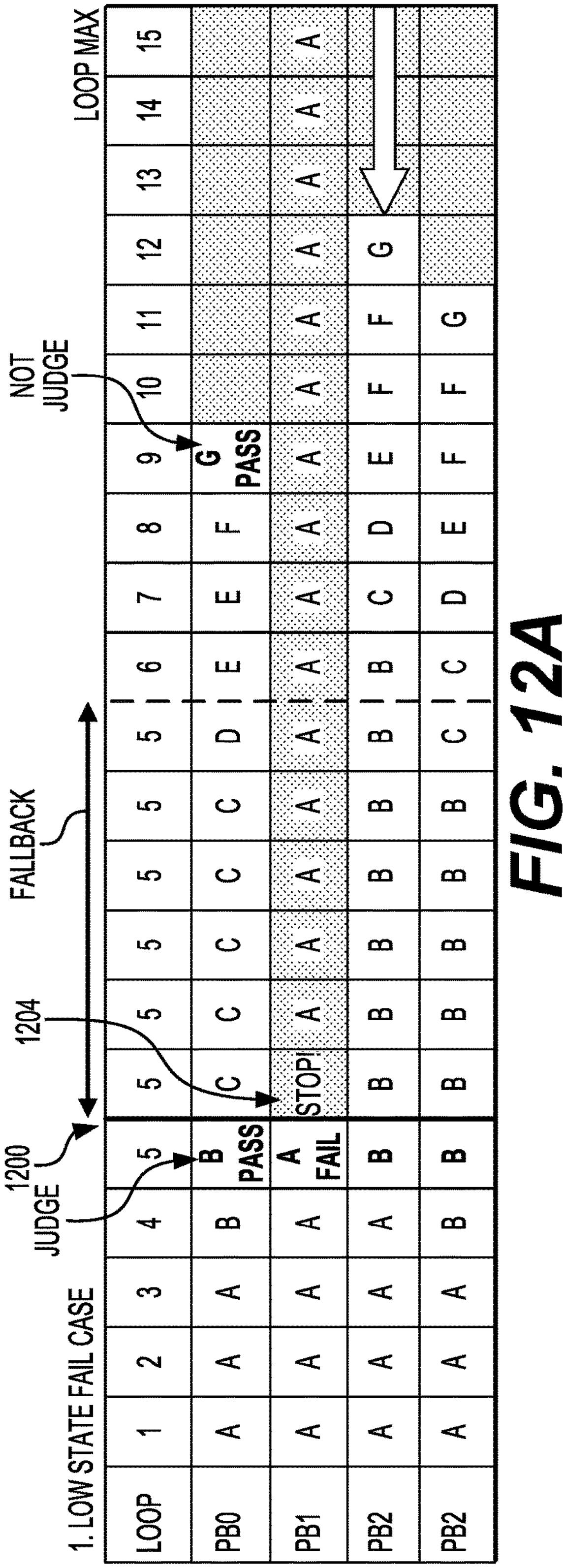
FIGS. 12A and 12B generally illustrate an example bit scan operation performed during a multi-plane programming operation.
Figure 12B:
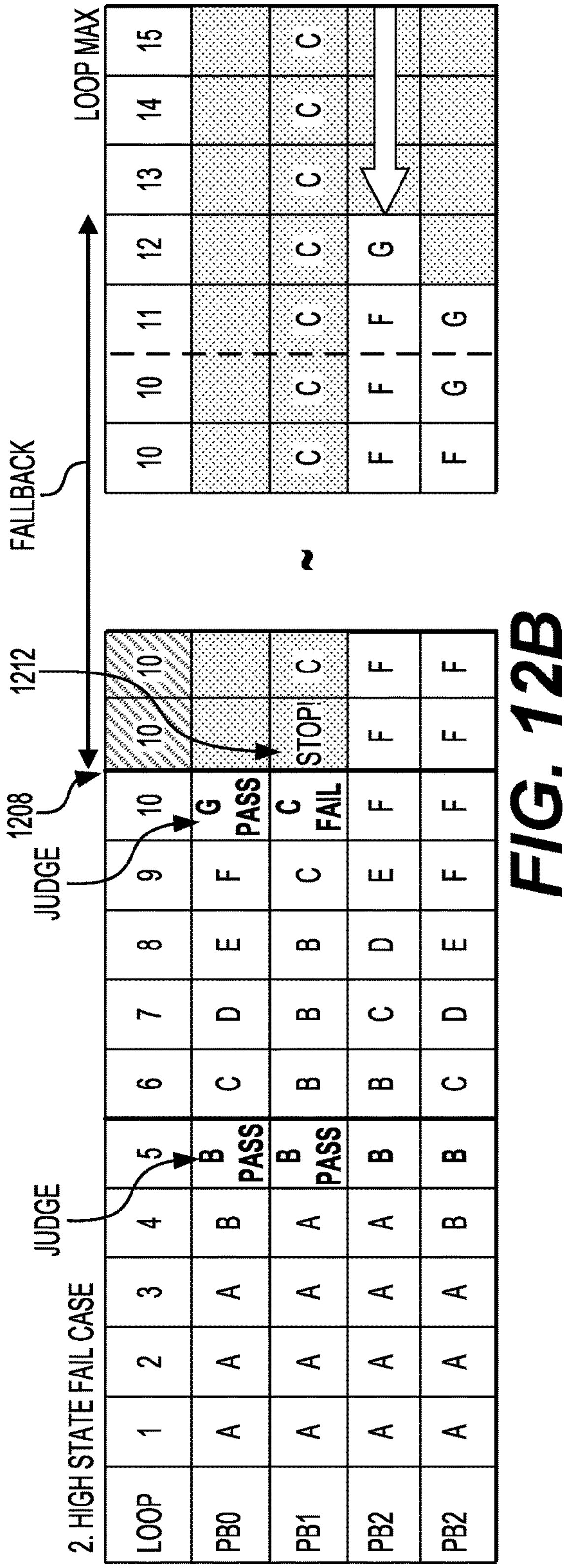

FIGS. 12A and 12B generally illustrate an example IBS operation performed (e.g., in an IBS mode) during a multi-plane programming operation configured to program a plurality of memory cells to various programmed data states. A memory cell may either remain in an erased state or be programmed to a programmed data state. For example, in a one bit per cell (SLC) memory device, there are two data states including the erased state and the programmed state. In a two-bit per cell memory device, there are four data states including the erased state and three higher data states referred to as the A, B and C data states. In a three-bit per cell (TLC) memory device, there are eight data states including the erased state and seven higher data states referred to as the A, B, C, D, E, F and G data states. In a four-bit per cell (QLC) memory device, there are sixteen data states including the erased state and fifteen higher data states. The data states may be referred to as the S0, S1, S2, S3, S4, S5, S6, S7, S8, S9, S10, S11, S12, S13, S14 and S15 data states where S0 is the erased state (see e.g., FIG. 10). In a five-bit per cell (PLC) memory device, there are thirty two data states including the erased state and thirty one higher data states. As described below (for example only), an IBS operation is described with respect to programming a multi-plane TLC memory device having memory cells programmable to the erased states and date states A, B, C, D, E, F, G.

In an example, the IBS operation includes two judgment/determination functions (e.g., at a low memory state and a high memory state, which may be referred to as judgment memory states). For example, a low state judgment may be performed for memory state B or C (e.g., a judgment to determine which planes have reached memory state B or have reached memory state C) in response to one or more criteria. In one example, the low state judgment may be performed subsequent to a programming loop in which one or more planes reached the memory state B (e.g., subsequent to a $5^{th}$ programming loop) as shown in FIG. 12A at 1200. As shown in FIG. 12A, plane PB1 did not reach memory state B (i.e., is still in memory state A) subsequent to a programming loop in which remaining planes (e.g., PB0, PB2, and PB3) reached memory state B. In other words, in this example, memory state A is considered a fail state for the low state judgment and plane PB1 is considered a slow (failed) plane.

In response to a determination that one or more planes failed (i.e., did not reach memory state B), an IBS judgment mode is triggered. In the IBS judgment mode, programming is stopped for any planes that did not reach memory state B as shown at 1204.

Conversely, if all planes reached memory state B prior to the low state judgment (i.e., all planes passed), a high memory state judgement may be performed. For example, a high state judgment may be performed for memory state G (e.g., a judgment to determine which planes have reached memory state G) in response to one or more criteria. In one example, the high state judgment may be performed subsequent to a programming loop in which one or more planes reached the memory state G (e.g., subsequent to a $10^{th}$ programming loop) as shown in FIG. 12B at 1208. The fail state may be defined as memory state C, D, E, or F (i.e., a memory state below memory state G). In this example, the fail state is defined as memory state C. As shown in FIG. 12B, plane PB1 did not reach memory state G (i.e., is still in memory state C) subsequent to a programming loop in which PB0 reached memory state G, and PB1 is considered a slow (failed) plane. Conversely, while planes PB2 and PB3 did not reach memory state G, planes PB2 and PB3 reached memory state F and are not considered slow planes.

In response to a determination that one or more planes failed (i.e., in this example, did not reach memory state D or higher), an IBS judgement mode is triggered. Accordingly, programming is stopped for any planes that did not reach memory state D as shown at 1212.

Typically, slow planes are determined to be failed planes that attack (i.e., leak and cause NPD to) other planes. Therefore, stopping programming of slow planes prevents NPD. In other words, slow planes are considered to be attacker planes while faster planes are considered to be victim planes. However, in some conditions, faster planes may behave as attacker planes. For example, word line leakage interference (WL-LI) defects that break one or more WLs may lead to a scenario in which the attacker plane programs faster than a slower victim plane (e.g., a faster plane may "fake" pass a memory state judgment).

Figure 13A:
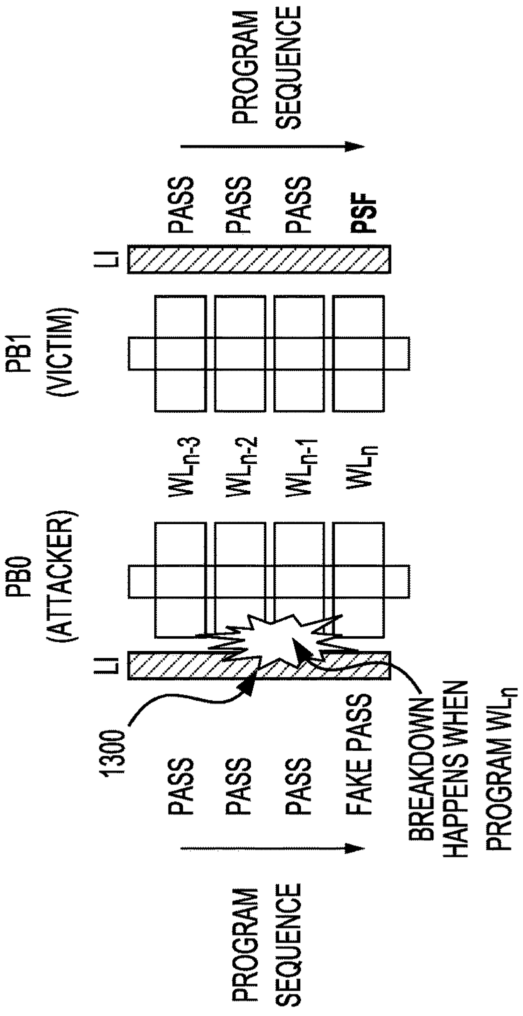
FIGS. 13A and 13B generally illustrates an example WL-LI breakdown that occurs when programming word line.
Figure 13B:
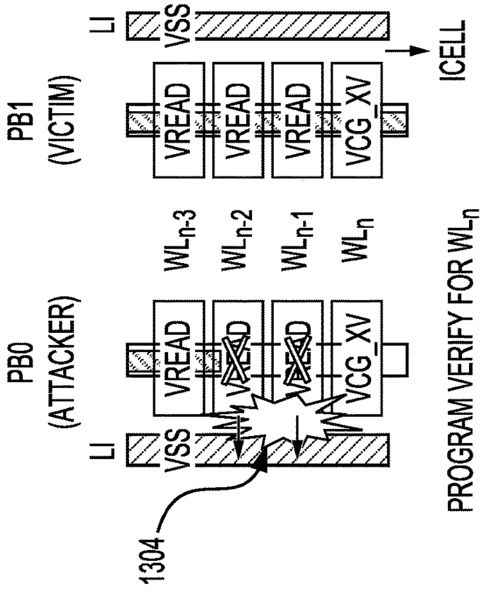

FIG. 13A generally illustrates an example WL-LI breakdown that occurs when programming word line WLn as shown at 1300, which may damage several WLs (e.g., WLn−2, WLn−1, and WLn). In an example, a WL-LI short may connect a read voltage Vread (~7V) to VSS (0V) during WLn program verify as shown at 1304 in FIG. 13B, which results in the plane PB0 reaching a pass status during a memory state judgement. However, in this example, the pass corresponds to a "fake" pass because memory holes cannot open after Vread is pulled down due to leakage. This causes PB0 (the attacker plane, in this example) to finish programming each state within an abnormally small number of loops. For example, memory cells in the plane may reach memory state A in one programming loop, memory state B in two programming loops, memory state C in three programming loops, etc. Conversely, a victim plane (PB1 in this example) programs much slower than in "normal" programming operations since the common program voltage VPGM may be pulled down. As a result, programming of the victim plane (PB1) will be terminated instead of terminating programming of the actual attacker plane (PB0).

NPD detection techniques according to the present disclosure are configured to determine whether a fast plane is an attacking plane causing NPD as described below in more detail. For example, implementation of the NPD detection techniques by the controller 1022 and/or other control circuitry may include determining whether a fast plane reaches a modified program verify threshold during the multi-plane programming operation.

In some examples, the controller 1022 performs the NPD detection using detection circuitry). For example only, the controller memory device 1000 as depicted in FIG. 10A is shown to include detection circuitry 1060. Although shown external to the controller 1022, in other examples all or portions of the detection circuitry 1060 may be implemented within the controller 1022, the control circuitry 1010, the control circuit 1050, and/or other portions of the memory device 1000.

Figure 14B:
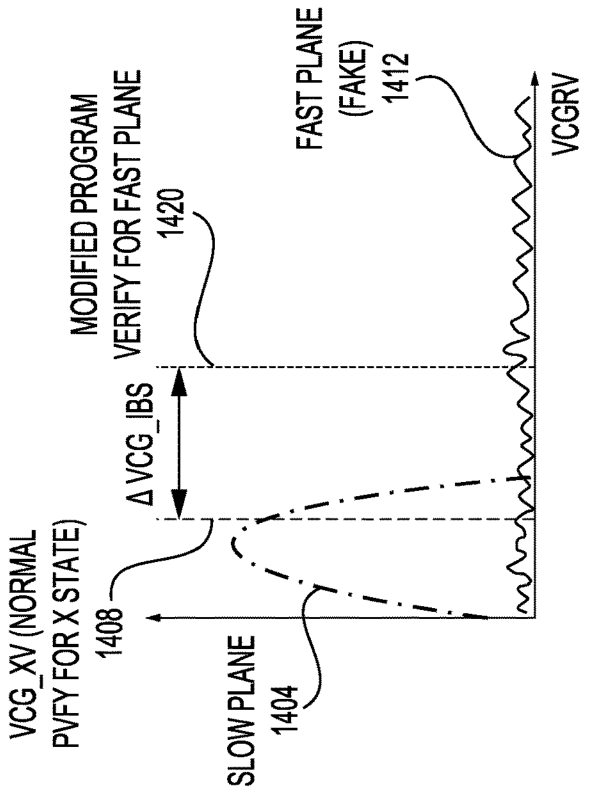
FIGS. 14A and 14B generally illustrate threshold voltage (Vt) distributions for a "normal" fast plane and a "fake" fast plane.
Figure 14A:
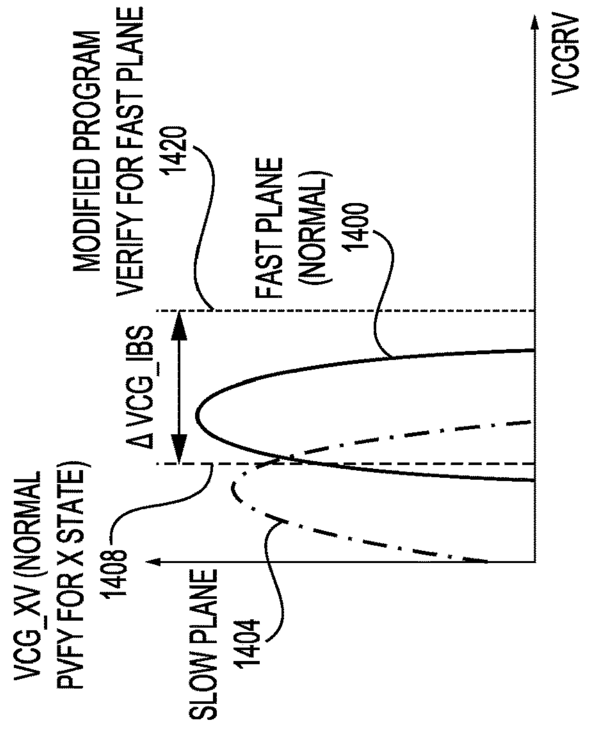

FIGS. 14A and 14B generally illustrate threshold voltage (Vt) distributions (e.g., of a verify control gate (VCG) voltage) for a "normal" fast plane (FIG. 14A) and a "fake" fast plane (in FIG. 14B). FIG. 14A shows an example voltage distribution 1400 for a "normal" fast plane relative to a voltage distribution 1404 for a slow plane. For example, a plane may be determined to be fast or slow based on a comparison to a (first) program verify threshold 1408 (e.g., based on a determination of a portion of the voltage distribution to be above or below the program verify threshold 1408) corresponding to a specific memory state (e.g., a memory state "X" for low or high memory state judgment). As shown in FIG. 14A, a plane corresponding to the voltage distribution 1400 is determined to be a fast plane due to a significant portion (e.g., more than half) of the voltage distribution 1400 being above the program verify threshold 1408. Conversely, a plane corresponding to the voltage distribution 1404 is determined to be a slow plane due to a significant portion (e.g., more than half) of the voltage distribution 1404 being below the program verify threshold 1408.

Conversely, FIG. 14B shows an example voltage distribution 1412 for a "fake" fast plane relative to the voltage distribution 1404 for the slow plane. The "fake" fast plane may be damaged or defective (e.g., due to WL-LI or other issues described above), causing the voltage distribution 1412 to be "noisy" and erratic and extend beyond the program verify threshold 1408. In other words, even though the corresponding plane was not consistently and correctly programmed to the selected memory state, program voltages read from a significant portion of memory cells in the plane exceed the program verify voltage 1408. Nonetheless, since the plane corresponding to the voltage distribution 1412 "passes" the memory state judgement, the slow plane corresponding to the voltage distribution 1404 may be identified as an attacker plane and no longer programmed (i.e., using conventional IBS techniques).

NPD systems and methods according to the present disclosure are configured to perform a modified multi-plane programming operation by comparing a voltage distribution of a fast plane to a modified (second) program verify threshold 1420. The modified program verify threshold 1408 is offset from (e.g., greater than) the program verify threshold by a VCG voltage offset (ΔVCG_IBS). In an example, the VCG voltage offset is approximately (e.g., within +/−10% of) 1V but may be less than or greater than 1V in other examples. Accordingly, a "normal" (i.e., non-defective) fast plane will pass the memory state judgment (e.g., based on the comparison to the program verify threshold 1408) but will not exceed the modified program verify threshold 1420. Accordingly, the slow plane corresponding to the voltage distribution 1404 may be determined to be a failed plane and programming of the failed plane will be terminated for subsequent programming loops.

Conversely, a "fake" fast plane will not only exceed the program verify threshold 1408 but will also exceed the modified program verify threshold 1420. Accordingly, rather than identifying the slow plane as a failed plane, the "fake" fast plane is identified as a failed plane and programming of the "fake" fast plane is terminated for subsequent programming loops. In an example, a memory state judgment is first performed to identify any slow planes. In response to at least one slow plane being identified, rather than determining that the slow plan is a failed (i.e., attacker) plane, a modified NPD detection operation is performed on one or more fast planes identified by the memory state judgment. In response to a determination that a voltage distribution of a fast plane passes (e.g., exceeds) the program verify threshold (e.g., 1408) but does not pass or exceed the modified program verify threshold (e.g., 1420), the slow plane is determined to be the failed (attacker plane) and programming for the slow plane is stopped for subsequent programming loops. Conversely, in response to a determination that the voltage distribution of the fast plane does pass or exceed the modified program verify threshold (e.g., 1420), the fast plane is determined to be the failed (attacker plane) and programming for the fast plane is stopped for subsequent programming loops.

Figure 15:
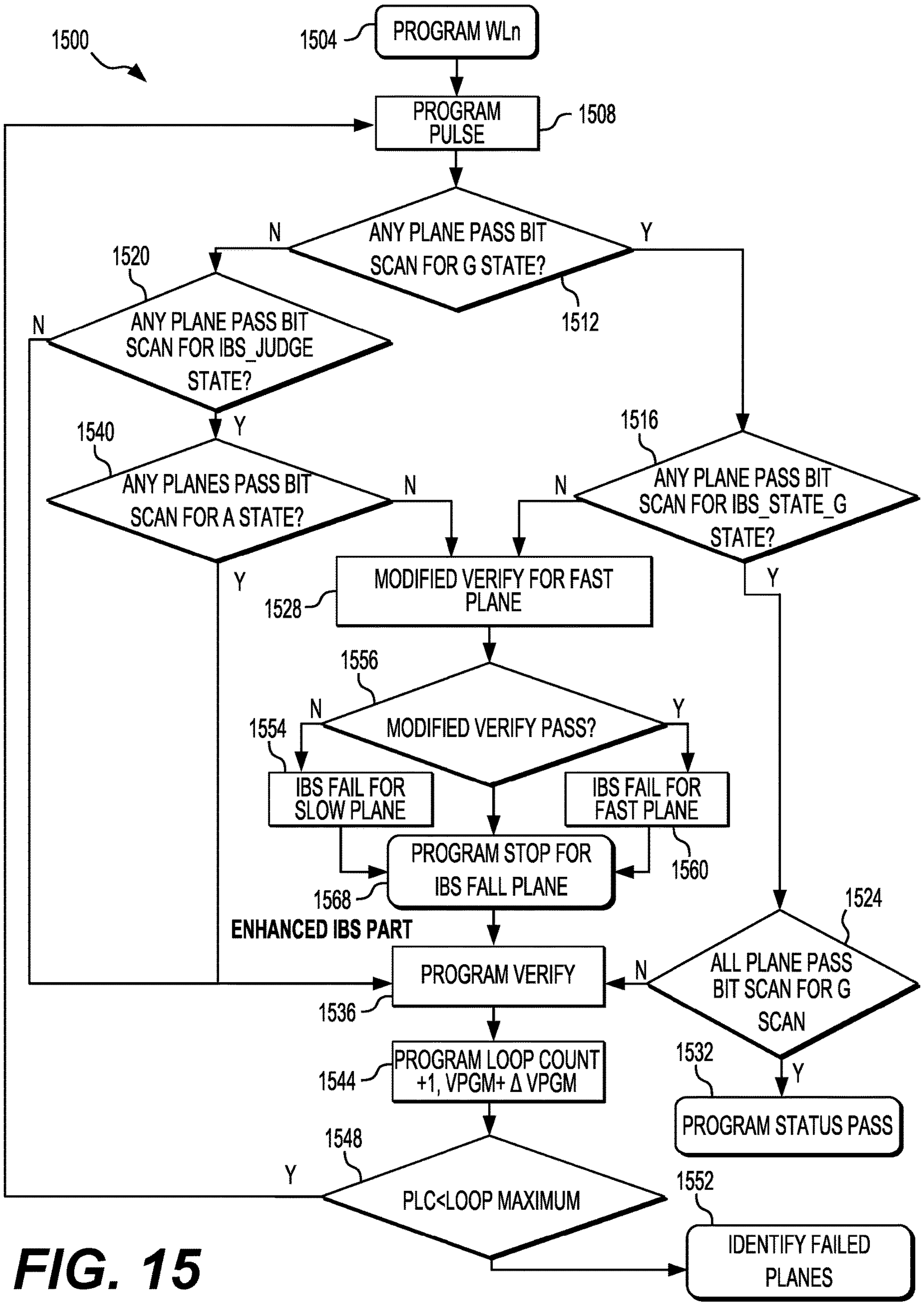
FIG. 15 illustrates steps of an example NPD detection method according to the present disclosure.

FIG. 15 illustrates steps of an example method 1500 for detecting NPD according to the present disclosure. For example, one or more processors or processing devices are configured to execute instructions to implement the method 1500, such as one or more of the processors of the systems described herein. In an example, the method 1500 includes controlling the memory device 1000 using the controller 1022 and/or other control circuitry described herein.

The method 1500 may correspond to a modified, multi-plane programming operation that includes a modified NPD detection operation according to the principles of the present disclosure. The method 1500 may include one or more (i.e., at least one) programming loops each having one or more (i.e., at least one) programming pulses, and steps corresponding to the modified NPD detection operation may be performed in one or more loops.

At 1504, the method 1500 begins a programming operation (e.g., begins programming selected word lines to be programmed in a multi-plane programming operation). In some examples, the method 1500 initializes a loop count corresponding to a count of a plurality of programming pulses. At 1508, one or more of the plurality of programming pulses of a program voltage are applied to selected word lines of the plurality of word lines while applying a pass voltage to unselected ones of the plurality of word lines during one of the plurality of programming loops of the programming operation.

At 1512, the method 1500 determines whether any plane passes a bit scan for a high (e.g., highest) memory state, such as the G memory state. If true, the method 1500 continues to 1516. If false, the method 1500 continues to 1520.

At 1516, the method 1500 determines whether all planes in the multi-plane programming operation pass a fail state check for the G state bit scan (e.g., IBS_STATE_G). For example, as described above, the fail state for the G state bit scan may be memory state C. Accordingly, at 1516, the method 1500 determines whether all planes have reached at least memory state D. If true, the method 1500 continues to 1524. If false, the method 1500 continues to 1528.

At 1524, the method 1500 determines whether all planes in the multi-plane programming operation pass the bit scan for the G memory state. If true, the method 1500 continues to 1532. If false, the method 1500 continues to 1536. At 1532, the method 1532 determines that the programming operation passed/was successful (e.g., that all planes in the multi-plane programming operating were successfully programmed) and sets the program states to "pass."

At 1520, the method 1500 determines whether any plane passed the bit scan for a selected judgment state IBS_JUDGE (e.g., memory state B for a low memory state judgment operation as described herein). If true, the method 1500 continues to 1540. If false, the method 1500 continues to 1536.

At 1540, the method 1500 determines whether all planes in the multi-plane programming operation pass a fail state check for the B state bit scan. For example, as described above, the fail state for the B state bit scan may be memory state A. Accordingly, at 1540, the method 1500 determines whether all planes have reached at least memory state B. If true, the method 1500 continues to 1536. If false, the method 1500 continues to 1528.

At 1536, the method 1500 programs a program verify operation. For example, verification pulses of a plurality of program verify voltages each associated with one of the plurality of data states are applied to the selected word lines to determine whether the memory cells have a target threshold voltage for a corresponding programmed memory state. At 1544, the method 1500 increases the loop count and the program voltage VPGM. At 1548, the method 1500 determines whether the loop count is less than or equal to a predetermined maximum loop quantity. If true, the method 1500 continues to 1508 to supply one or more additional programming pulses of the program voltage to selected word lines to program memory cells that did not pass the program verify operation. If false, the method 1500 continues to 1552. At 1552, the multi-plane programming operation is determined to be complete, and any planes that were not successfully programmed to the memory state G are identified/flagged as failed planes and are not programmed in subsequent programming operations.

At 1528, the method 1500 performs the modified NPD detection operation (e.g., a modified program verify operation) as described herein. For example, at 1556, the method 1500 determines whether the voltage distribution of any fast plane identified at 1512 or 1520 exceeds the modified program verify threshold. If true, the method 1500 continues to 1560. If false, the method 1500 continues to 1564.

At 1560, the method 1500 identifies/marks the fast plane as a failed plane and, at 1568, terminates programming for the failed fast plane in subsequent programming loops. Conversely, at 1564, the method 1500 identifies/marks any slow plane (e.g., a slow plane identified at 1560 or 1540) as a failed plane and terminates, at 1568, programming for the failed slow plane in subsequent programming loops. Accordingly, at 1528, 1556, 1560, 1564, and 1568, the method 1500 performs a modified NPD detection operation according to the present disclosure to determine whether one or more fast planes (e.g., detected using bit scan techniques), instead of a slow plane, should be identified as a failed plane causing NPD (i.e., is an attacker plane).

Various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that includes customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electromagnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it includes one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Additionally, the terms "couple," "coupled," or "couples," where may be used herein, are intended to mean either a direct or an indirect connection. Thus, if a first device couples, or is coupled to, a second device, that connection may be by way of a direct connection or through an indirect connection via other devices (or components) and connections.

Regarding, the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that includes the element.

The terms "a," "an," and "the" also refer to "one or more" unless expressly specified otherwise. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or more," "ones or more," and/or "ones or mores" according to set theory, unless expressly specified otherwise.

The foregoing detailed description has been presented for purposes of illustration and description. It is not intended to be exhaustive or be limited to the precise form disclosed. Many modifications and variations are possible in light of the above description. The described embodiments were chosen to best explain the principles of the technology and its practical application to thereby enable others skilled in the art to best utilize the technology in various embodiments and with various modifications as are suited to the particular use contemplated. The scope of the technology is defined by the claims appended hereto.

What is claimed is:

1. A memory device, comprising:
- a plurality of memory cells arranged in a plurality of planes; and
- control circuitry configured to perform a multi-plane programming operation in which memory cells in each of the plurality of planes are programmed in a single programming operation, wherein, to perform the multi-plane programming operation, the control circuitry is configured to detect a neighbor plane disturb (NPD) defect during the multi-plane programming operation by:
  - performing a bit scan operation to identify, based on a first program verify threshold, a fast plane and a slow plane from among the plurality of planes, wherein identifying the fast plane includes determining that a first portion of the fast plane is above the first program verify threshold;
  - in response to determining that the first portion of the fast plane is above the first program verify threshold, determining whether a second portion of the fast plane is above a second program verify threshold greater than the first program verify threshold;
  - in response to determining that the second portion of the fast plane is above the second program verify threshold, identifying the fast plane as a failed plane;
  - in response to determining that the second portion of the fast plane is not above the second program verify voltage, identifying the slow plane as the failed plane; and
  - terminating programming of the identified failed plane.

2. The memory device of claim 1, wherein identifying the fast plane includes determining, based on the first program verify threshold, whether the fast plane has reached a judgment memory state.

3. The memory device of claim 2, wherein the second program verify threshold corresponds to a memory state higher than the judgment memory state.

4. The memory device of claim 1, wherein, to perform the bit scan operation, the control circuitry is configured to determine respective portions of voltage distributions of the memory cells of each of the plurality of planes that are greater than the first program verify threshold.

5. The memory device of claim 1, wherein the second program verify threshold is offset from the first program verify threshold by approximately 1 V.

6. A method for operating a memory device including a plurality of memory cells arranged in a plurality of planes, the method comprising:
- performing a multi-plane programming operation in which memory cells in each of the plurality of planes are programmed in a single programming operation, wherein, to perform the multi-plane programming operation, a neighbor plane disturb (NPD) defect is detected during the multi-plane programming operation by:
  - performing a bit scan operation to identify, based on a first program verify threshold, a fast plane and a slow plane from among the plurality of planes, wherein identifying the fast plane includes determining that a first portion of the fast plane is above the first program verify threshold;
  - in response to determining that the first portion of the fast plane is above the first program verify threshold, determining whether a second portion the fast plane is above a second program verify threshold greater than the first program verify threshold;
  - in response to determining that the second portion of the fast plane is above the second program verify threshold, identifying the fast plane as a failed plane; and
- in response to determining that the second portion of the fast plane is not above the second program verify voltage, identifying the slow plane as the failed plane; and
- terminating programming of the identified failed plane.

7. The method of claim 6, wherein identifying the fast plane includes determining, based on the first program verify threshold, whether the fast plane has reached a judgment memory state.

8. The method of claim 7, wherein the second program verify threshold corresponds to a memory state higher than the judgment memory state.

9. The method of claim 6, further comprising, to perform the bit scan operation, determining respective portions of voltage distributions of the memory cells of each of the plurality of planes that are greater than the first program verify threshold.

10. The method of claim 6, wherein the second program verify threshold is offset from the first program verify threshold by approximately 1 V.

11. A memory device, comprising:
- a plurality of memory cells arranged in a plurality of planes; and
- control means for performing a multi-plane programming operation in which memory cells in each of the plurality of planes are programmed in a single programming operation, wherein, to perform the multi-plane programming operation, the control means detects a neighbor plane disturb (NPD) defect during the multi-plane programming operation by:
  - performing a bit scan operation to identify, based on a first program verify threshold, a fast plane and a slow plane from among the plurality of planes, wherein identifying the fast plane includes determining that a first portion of the fast plane is above the first program verify threshold;
  - in response to determining that the first portion of the fast plane is above the first program verify threshold, determining whether a second portion of the fast plane is above a second program verify threshold greater than the first program verify threshold;
  - in response to determining that the second portion of the fast plane is above the second program verify threshold, identifying the fast plane as a failed plane;
  - in response to determining that the second portion of the fast plane is not above the second program verify voltage, identifying the slow plane as the failed plane; and
  - terminating programming of the identified failed plane.

12. The memory device of claim 11, wherein identifying the fast plane includes determining, based on the first program verify threshold, whether the fast plane has reached a judgment memory state.

13. The memory device of claim 12, wherein the second program verify threshold corresponds to a memory state higher than the judgment memory state.

14. The memory device of claim 13, wherein, to perform the bit scan operation, the control means determines respective portions of voltage distributions of the memory cells of each of the plurality of planes that are greater than the first program verify threshold.

* * * * *